(12) United States Patent
Hanzawa et al.

(10) Patent No.: US 10,811,447 B2
(45) Date of Patent: Oct. 20, 2020

(54) SOLID-STATE IMAGING DEVICE, DRIVING METHOD, AND ELECTRONIC EQUIPMENT

(71) Applicant: Sony Corporation, Tokyo (JP)

(72) Inventors: Katsuhiko Hanzawa, Kanagawa (JP); Yuuichi Kaji, Kanagawa (JP)

(73) Assignee: Sony Corporation, Tokyo (JP)

( * ) Notice: Subject to any disclaimer, the term of this patent is extended or adjusted under 35 U.S.C. 154(b) by 46 days.

(21) Appl. No.: 16/080,153

(22) PCT Filed: Feb. 20, 2017

(86) PCT No.: PCT/JP2017/006077
§ 371 (c)(1),
(2) Date: Aug. 27, 2018

(87) PCT Pub. No.: WO2017/150240
PCT Pub. Date: Sep. 8, 2017

(65) Prior Publication Data
US 2019/0051680 A1    Feb. 14, 2019

(30) Foreign Application Priority Data

Mar. 4, 2016  (JP) ................................ 2016-041697
Aug. 18, 2016 (JP) ................................ 2016-160653

(51) Int. Cl.
*H01L 31/062* (2012.01)
*H01L 31/113* (2006.01)
(Continued)

(52) U.S. Cl.
CPC ........... *H01L 27/146* (2013.01); *H04N 5/355* (2013.01); *H04N 5/35518* (2013.01);
(Continued)

(58) Field of Classification Search
CPC . H01L 27/146; H01L 27/14603–14636; H01L 27/14–14893; H04N 5/379;
(Continued)

(56) References Cited

U.S. PATENT DOCUMENTS 7,924,333 B2 *    4/2011  Yin ................... H01L 27/14603
                                                           250/208.1
2004/0046101 A1*  3/2004  Nakamura ........ H01L 27/14643
                                                              250/200
(Continued)

FOREIGN PATENT DOCUMENTS

JP    2006-352804 A    12/2006
JP    2007-189405 A     7/2007
(Continued)

OTHER PUBLICATIONS

International Search Report and Written Opinion and English translations thereof dated Apr. 18, 2017 in connection with International Application No. PCT/JP2017/006077.
(Continued)

*Primary Examiner* — Calvin Y Choi
(74) *Attorney, Agent, or Firm* — Wolf, Greenfield & Sacks, P.C.

(57) ABSTRACT

The present disclosure relates to a solid-state imaging device, a driving method, and electronic equipment that permit imaging of a wide dynamic range image with higher quality.
The solid-state imaging device includes a pixel region and a circuit region. A plurality of pixels that perform photoelectric conversion are arranged in the pixel region. At least a logarithmic conversion circuit is arranged in the circuit region. The logarithmic conversion circuit reads out a pixel signal from the pixel through a logarithmic readout scheme in which the pixel signal changes approximately logarithmically in proportion to the amount of light received by the
(Continued)

pixel. Also, the logarithmic conversion circuit can switch between a logarithmic readout scheme and a linear readout scheme when the pixel signal is read out from the pixel. The present technology is applicable, for example, to a CMOS image sensor.

20 Claims, 27 Drawing Sheets

(51) Int. Cl.
  *H01L 27/146* (2006.01)
  *H04N 5/355* (2011.01)
  *H04N 5/369* (2011.01)
  *H04N 5/3745* (2011.01)
  *H04N 5/374* (2011.01)
  *H04N 5/378* (2011.01)
(52) U.S. Cl.
  CPC ......... *H04N 5/35527* (2013.01); *H04N 5/374* (2013.01); *H04N 5/378* (2013.01); *H04N 5/379* (2018.08); *H04N 5/3745* (2013.01)
(58) Field of Classification Search
  CPC ............... H04N 5/355; H04N 5/35518; H04N 5/35527; H04N 5/374; H04N 5/3745; H04N 5/378
  USPC ........................................................ 257/292
  See application file for complete search history.

(56) References Cited

U.S. PATENT DOCUMENTS

| | | | |
|---|---|---|---|
| 2005/0012838 A1* | 1/2005 | Kusuda | H04N 3/155 348/308 |
| 2005/0264683 A1 | 12/2005 | Kamon et al. | |
| 2008/0018766 A1 | 1/2008 | Mijatake | |
| 2008/0252762 A1* | 10/2008 | Iwamoto | H04N 5/35518 348/301 |
| 2008/0303928 A1* | 12/2008 | Kusuda | H04N 5/35518 348/300 |
| 2009/0140125 A1 | 6/2009 | Takayama | |
| 2012/0287294 A1 | 11/2012 | Kaizu et al. | |
| 2016/0079089 A1* | 3/2016 | Koezuka | H01L 29/78648 438/104 |

FOREIGN PATENT DOCUMENTS

| | | |
|---|---|---|
| JP | 2008-028474 A | 2/2008 |
| JP | 2010-263647 A | 11/2010 |
| JP | 2012-257193 A | 12/2012 |
| WO | WO 2006/064629 A1 | 6/2006 |
| WO | WO 2006/129460 A1 | 12/2006 |
| WO | WO 2015/111389 A1 | 7/2015 |

OTHER PUBLICATIONS

International Preliminary Report on Patentability and English translation thereof dated Sep. 13, 2018 in connection with International Application No. PCT/JP2017/006077.

* cited by examiner

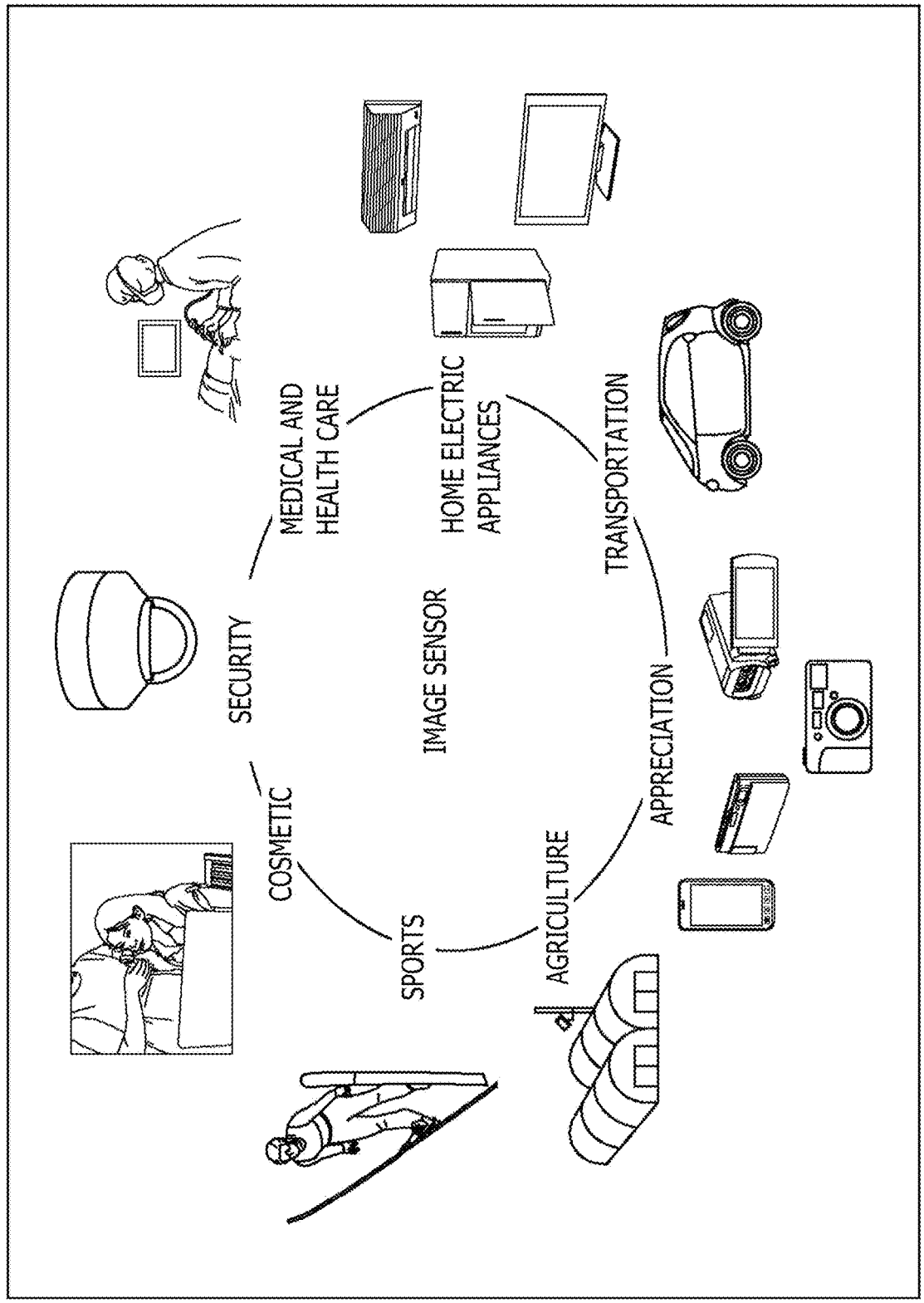

SOLID-STATE IMAGING DEVICE, DRIVING METHOD, AND ELECTRONIC EQUIPMENT

CROSS-REFERENCE TO RELATED APPLICATIONS

This application claims the benefit under 35 U.S.C. § 371 as a U.S. National Stage Entry of International Application No. PCT/JP2017/006077, filed in the Japanese Patent Office as a Receiving Office on Feb. 20, 2017, which claims priority to Japanese Patent Application Number JP2016-060653, filed in the Japanese Patent Office on Aug. 18, 2016, and Japanese Patent Application Number JP2016-041697, filed in the Japanese Patent Office on Mar. 4, 2016, the contents of each of which is hereby incorporated by reference in its entirety.

TECHNICAL FIELD

The present disclosure relates to a solid-state imaging device, a driving method, and electronic equipment, and particularly to a solid-state imaging device, a driving method, and electronic equipment that permit imaging of a wide dynamic range image with higher quality.

BACKGROUND ART

Capture of a wide dynamic range image has been demanded to date by a wide variety of applications, allowing various wide dynamic range technologies to be developed.

For example, PTL 1 discloses a solid-state imaging apparatus that offers not only low noise and high sensitivity but also a wide dynamic range by using an integral type logarithmic conversion circuit.

CITATION LIST

Patent Literature

[PTL 1]
JP 2008-28474A

SUMMARY

Technical Problem

However, conventional solid-state imaging apparatuses were configured so that a logarithmic conversion circuit was arranged within a pixel, making it difficult to optimize the sizes and properties of transistors included in the logarithmic conversion circuit. For this reason, there is a demand to achieve capture of a wide dynamic range image with high quality by optimizing the sizes and properties of the transistors included in the logarithmic conversion circuit.

The present disclosure has been devised in light of such circumstances, and it is an object of the present disclosure to allow capture of a wide dynamic range image with higher quality.

Solution to Problem

A solid-state imaging device of an aspect of the present disclosure includes a pixel region and a circuit region. A plurality of pixels that perform photoelectric conversion are arranged in the pixel region. At least a logarithmic conversion circuit is arranged in the circuit region. The logarithmic conversion circuit reads out a pixel signal from the pixel through a logarithmic readout scheme in which the pixel signal changes approximately logarithmically in proportion to the amount of light received by the pixel.

A driving method of an aspect of the present disclosure is a driving method of a solid-state imaging device that includes a pixel region and a circuit region. A plurality of pixels that perform photoelectric conversion are arranged in the pixel region. At least a logarithmic conversion circuit is arranged in the circuit region. The logarithmic conversion circuit reads out a pixel signal from the pixel through a logarithmic readout scheme in which the pixel signal changes approximately logarithmically in proportion to the amount of light received by the pixel. In the case where a pixel signal is read out from the pixel through the logarithmic readout scheme, a source voltage is supplied to the pixel via a diode-connected MOS (Metal-Oxide Semiconductor) transistor.

Electronic equipment of an aspect of the present disclosure includes a pixel region and a circuit region. A plurality of pixels that perform photoelectric conversion are arranged in the pixel region. At least a logarithmic conversion circuit is arranged in the circuit region. The logarithmic conversion circuit reads out a pixel signal from the pixel through a logarithmic readout scheme in which the pixel signal changes approximately logarithmically in proportion to the amount of light received by the pixel.

In an aspect of the present disclosure, a plurality of pixels that perform photoelectric conversion are arranged in a pixel region. Also, at least a logarithmic conversion circuit is arranged in a circuit region. The logarithmic conversion circuit reads out a pixel signal from the pixel through a logarithmic readout scheme in which the pixel signal changes approximately logarithmically in proportion to the amount of light received by the pixel.

Advantageous Effect of Invention

According to an aspect of the present disclosure, it is possible to capture a wide dynamic range image with higher quality.

BRIEF DESCRIPTION OF DRAWINGS

FIG. 28 is a diagram illustrating a usage example using an image sensor.

DESCRIPTION OF EMBODIMENTS

A detailed description will be given below of a specific example of an embodiment to which the present technology is applied with reference to drawings.

Figure 1:
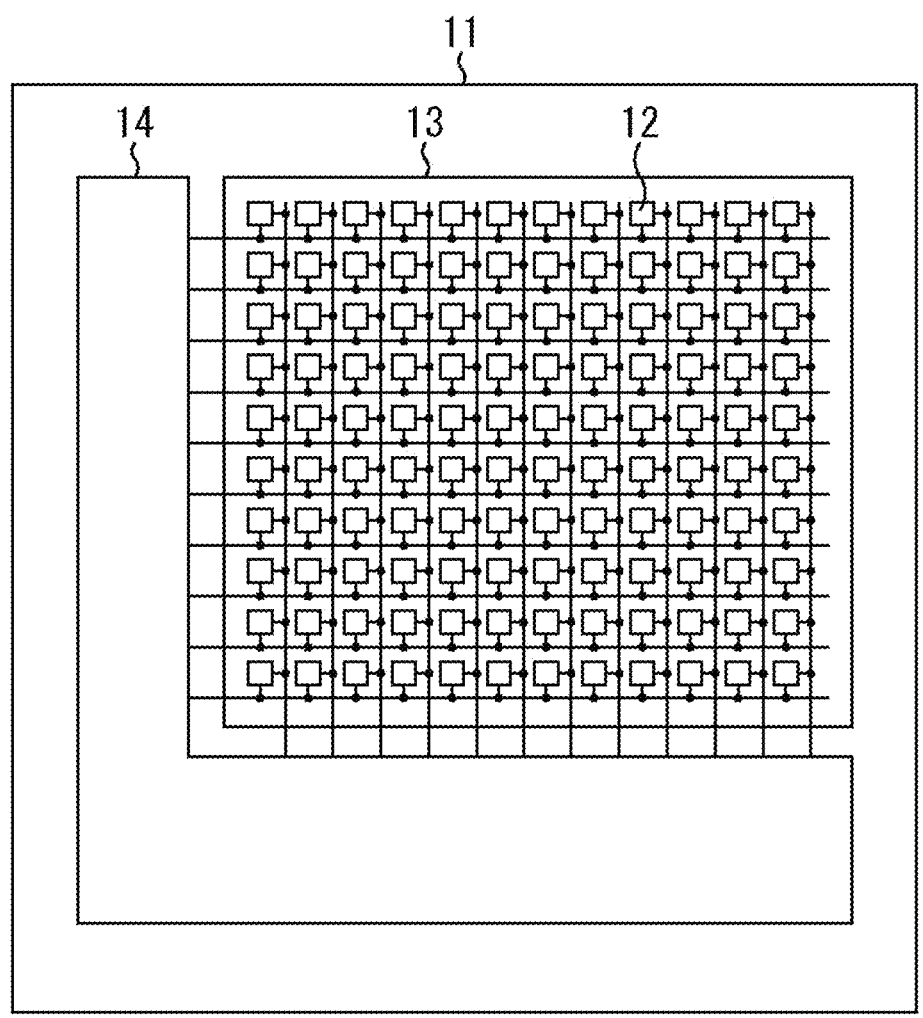
FIG. 1 is a block diagram illustrating a configuration example of an embodiment of an imaging device to which the present technology is applied.

FIG. 1 is a block diagram illustrating a configuration example of an embodiment of an imaging device to which the present technology is applied.

As illustrated in FIG. 1, the imaging device 11 includes a pixel region 13 and a circuit region 14. A plurality of pixels 12 that perform photoelectric conversion are arranged in the pixel region 13. Circuits for driving the readout of pixel signals from these pixels 12 are arranged in the circuit region 14. The imaging device 11 is, for example, a CMOS (Complementary Metal Oxide Semiconductor) image sensor.

The pixel 12 converts received light into an electric charge and outputs a pixel signal whose level is proportional to the amount of light received by the pixel.

The pixel region 13 is a light-receiving surface that receives light concentrated by optics that is not depicted and captures a picture of a subject whose image is formed on the light-receiving surface by the plurality of pixels 12 that are arranged in an array in the pixel region 13.

The circuit region 14 is where vertical and horizontal drive circuits for driving the pixels 12 are provided, and an AD (Analog to Digital) conversion circuit 31 and a logarithmic conversion circuit 32 illustrated in FIG. 2 which will be described later are, for example, provided.

It should be noted that the imaging device 11 may be configured such that the pixel region 13 and the circuit region 14 are formed on the same chip or such that the pixel region 13 and the circuit region 14 are formed on different chips.

Figure 2:
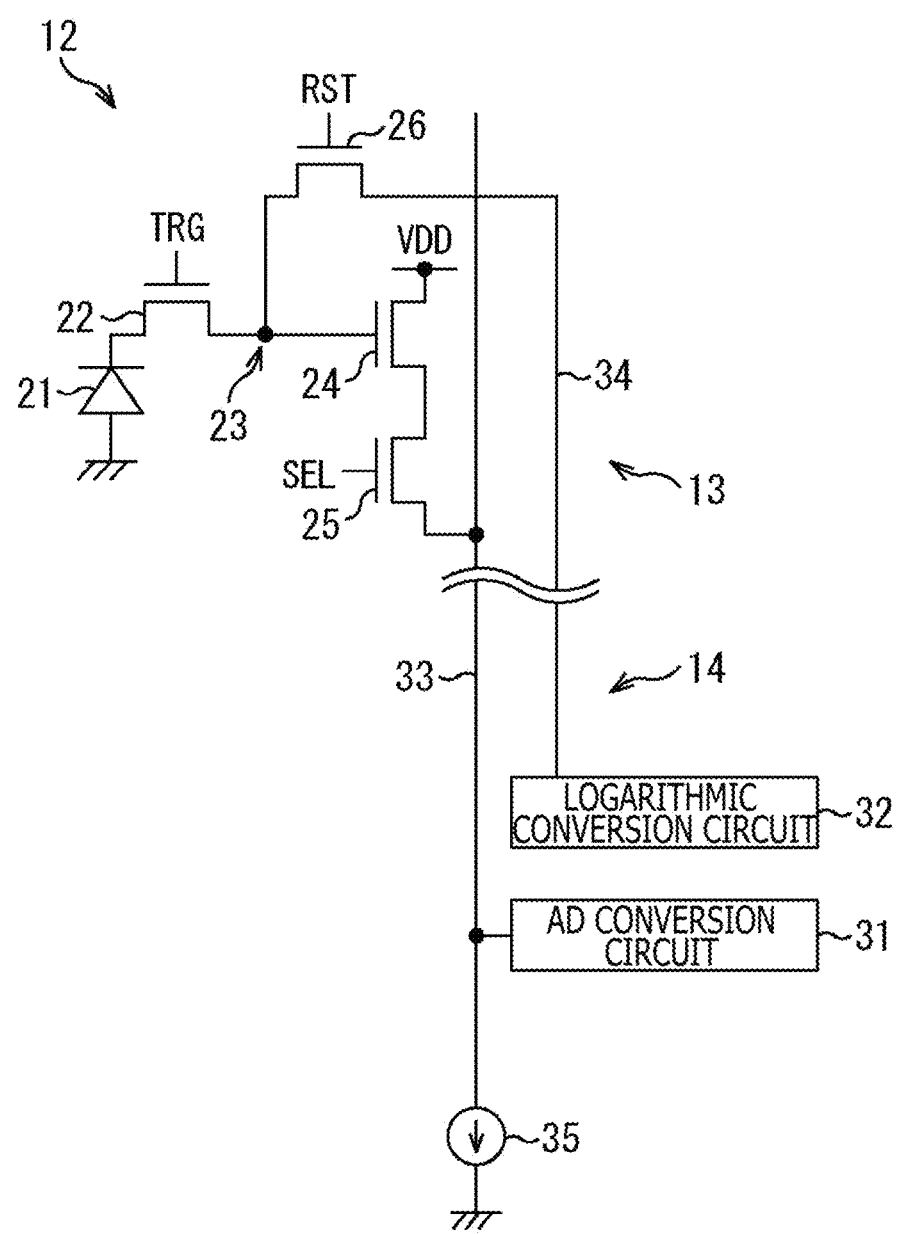
FIG. 2 is a circuit diagram illustrating an example of a basic circuit configuration of a pixel.

Next, FIG. 2 is a circuit diagram illustrating an example of a basic circuit configuration of the pixel 12 illustrated in FIG. 1.

As illustrated in FIG. 2, the pixel 12 provided in the pixel region 13 includes a photodiode 21, a transfer transistor 22, an FD (Floating Diffusion) section 23, an amplifying transistor 24, a selection transistor 25, and a reset transistor 26. Also, the AD conversion circuit 31 and the logarithmic conversion circuit 32 provided in the circuit region 14 are connected to the pixel 12 respectively via signal lines 33 and 34. Then, a current source 35 for reading out a pixel signal from the pixel 12 into the AD conversion circuit 31 is connected to the signal line 33, and the amplifying transistor 24 and the current source 35 form a source follower.

The photodiode 21 is a photoelectric conversion section that converts incident light into an electric charge through photoelectric conversion and accumulates the electric charge. The photodiode 21 has its anode terminal grounded and its cathode terminal connected to the transfer transistor 22.

The transfer transistor 22 is driven in accordance with a transfer signal TRG, and when the transfer transistor 22 turns ON, the electric charge accumulated in the photodiode 21 is transferred to the FD section 23.

The FD section 23 is a floating diffusion region that has a given storage capacitance that is connected to the gate electrode of the amplifying transistor 24. The FD section 23 accumulates the electric charge transferred from the photodiode 21 via the transfer transistor 22.

The amplifying transistor 24 outputs a pixel signal whose level is proportional to the electric charge accumulated in the FD section 23 (i.e., potential of the FD section 23) to the signal line 33 via the selection transistor 25. That is, because of the configuration of connecting the FD section 23 to the gate electrode of the amplifying transistor 24, the FD section 23 and the amplifying transistor 24 function as a conversion section that converts an electric charge produced by the photodiode 21 into a pixel signal whose level is proportional to the electric charge.

The selection transistor 25 is driven in accordance with a selection signal SEL, and when the selection transistor 25 turns ON, the pixel signal output from the amplifying transistor 24 can be output to the signal line 33, placing the pixel 12 into a selected state for outputting a pixel signal from the pixel 12.

The reset transistor 26 is driven in accordance with a reset signal RST, and when the reset transistor 26 turns ON, the FD section 23 is connected to the logarithmic conversion circuit 32 via the signal line 34.

The AD conversion circuit 31 is connected to the selection transistor 25 by the signal line 33, converts the analog pixel signal output from the amplifying transistor 24 via the selection transistor 25 into a digital signal, and supplies the signal to the circuit at the succeeding stage that is not depicted.

The logarithmic conversion circuit 32 is connected to the reset transistor 26 by the signal line 34 and can switch the readout scheme for reading out a pixel signal from the pixel 12 between linear mode and logarithmic mode. Linear mode is a readout scheme in which a pixel signal whose level changes linearly in proportion to the amount of light received by the pixel 12 is read out from the pixel 12, and logarithmic mode is a readout scheme in which a pixel signal whose level changes logarithmically in proportion to the amount of light received by the pixel 12 is read out from the pixel 12.

Figure 3:
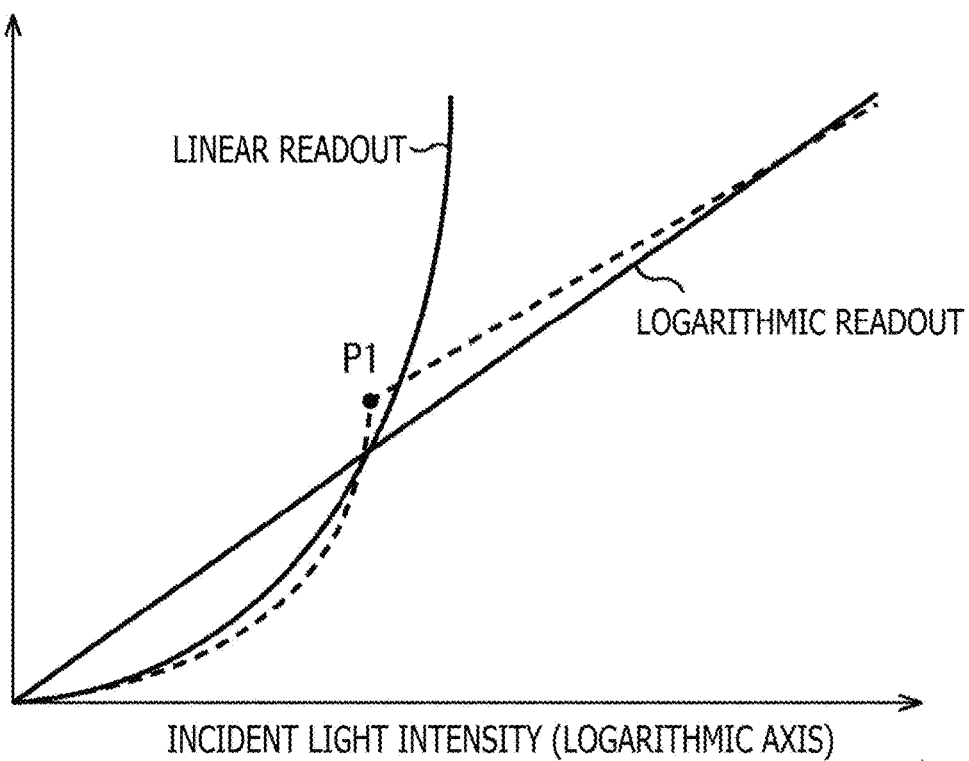
FIG. 3 is a diagram describing switching between linear readout and logarithmic readout.

A description will be given here of switching between linear readout and logarithmic readout with reference to FIG. 3. FIG. 3 plots a sensor output along the vertical axis (linear axis) against an incident light intensity along the horizontal axis (logarithmic axis) and illustrates, with solid lines, a pixel signal read out through linear readout and a pixel signal read out through logarithmic readout from the pixel 12 by the logarithmic conversion circuit 32. For example, when an enable signal LOGEN (referred to FIG. 4 to be described later) is at low level, linear readout is selected, and when the enable signal LOGEN is at high level, logarithmic readout is selected, allowing these readout schemes to be switched from one to the other by turning a switch ON or OFF with the enable signal LOGEN. It should be noted that, as illustrated with a dotted line, linear readout may be switched over to logarithmic readout or vice versa at a point P1 on the basis of the incident light intensity, and linear readout may be selected in the case where the incident light intensity is low, and logarithmic readout may be selected in the case where the incident light intensity is high.

Thus, the imaging device 11 can switch between linear readout and logarithmic readout seamlessly using the logarithmic conversion circuit 32 without changing the pixel properties of the pixel 12.

Figure 4:
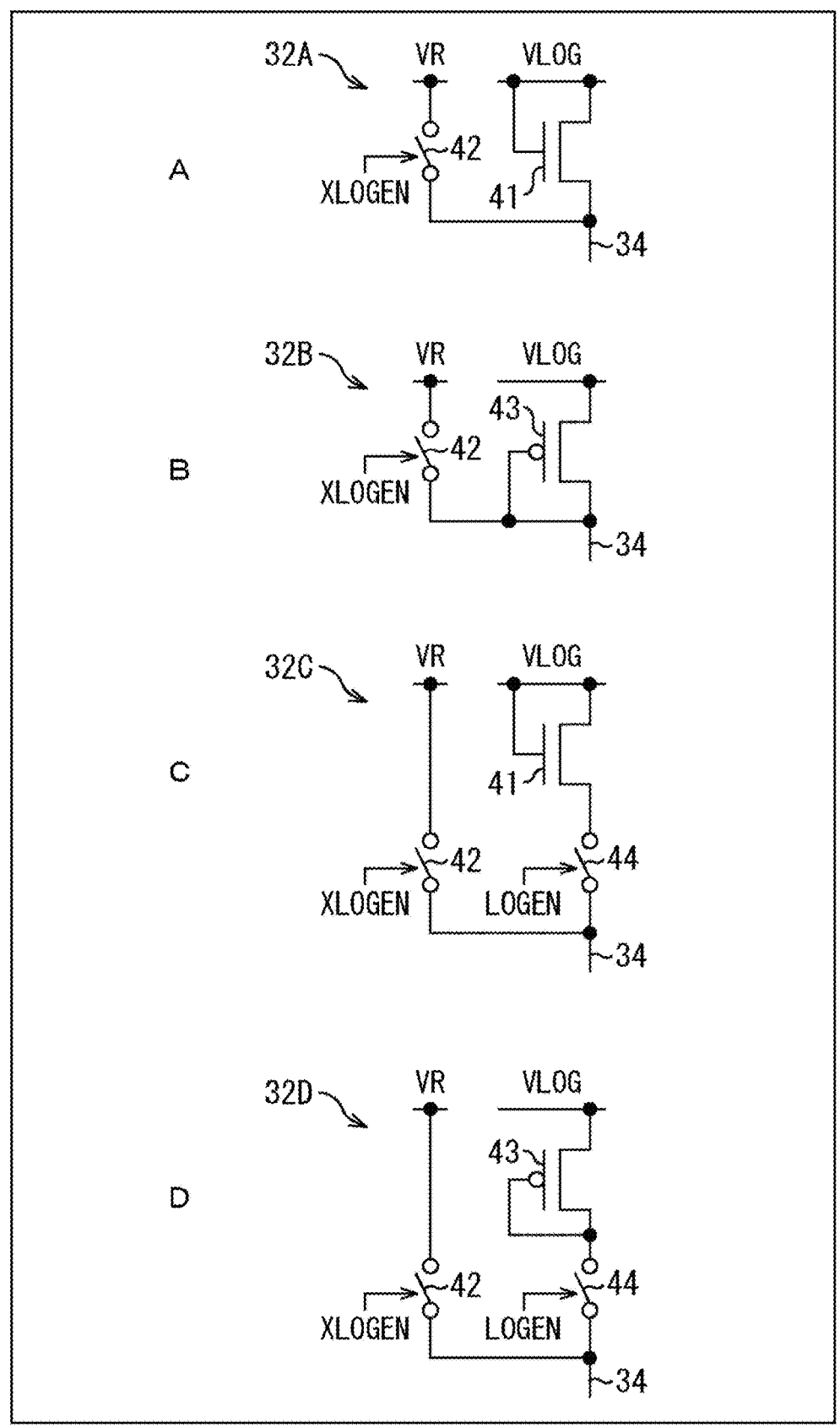
FIG. 4 depicts diagrams illustrating circuit configuration diagrams of logarithmic conversion circuits.
Figure 5:
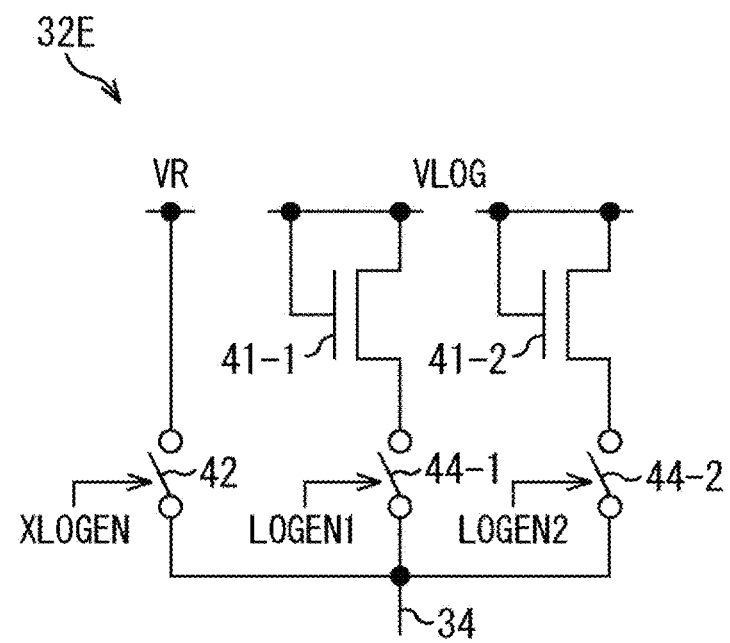
FIG. 5 is a diagram illustrating a circuit configuration diagram of a logarithmic conversion circuit.

Next, FIGS. 4 and 5 are diagrams illustrating circuit configuration examples of the logarithmic conversion circuit 32.

FIG. 4A illustrates a first circuit configuration example of the logarithmic conversion circuit 32.

As illustrated in FIG. 4A, a logarithmic conversion circuit 32A includes a combination of an NMOS (N-channel Metal-Oxide Semiconductor) transistor 41 and a switch 42. The NMOS transistor 41 has its source connected to the reset transistor 26 (FIG. 2) by the signal line 34 and its drain and gate connected to a power supply VLOG. Also, the switch 42 is arranged in such a manner as to connect the signal line 34 and a power supply VR and opens and closes in accordance with an inverted enable signal XLOGEN, an inversion of the enable signal LOGEN that enables the readout of a logarithmic signal.

The logarithmic conversion circuit 32A is thus configured and can switch between linear mode and logarithmic mode seamlessly in accordance with the inverted enable signal XLOGEN when a pixel signal is read out from the pixel 12.

That is, in the case of linear mode, the switch 42 turns ON as a result of the inverted enable signal XLOGEN rising to high level, and the power supply VR is connected to the pixel 12 via the switch 42. As a result, a pixel signal that changes linearly in proportion to the amount of light received by the pixel 12 is read out. Also, in the case of logarithmic mode, the switch 42 turns OFF as a result of the inverted enable signal XLOGEN falling to low level, and the power supply VLOG is connected to the pixel 12 via the diode-connected NMOS transistor 41. As a result, a pixel signal that changes logarithmically in proportion to the amount of light received by the pixel 12 is read out.

FIG. 4B illustrates a second circuit configuration example of the logarithmic conversion circuit 32.

As illustrated in FIG. 4B, a logarithmic conversion circuit 32B includes a combination of a PMOS (P-channel Metal-Oxide Semiconductor) transistor 43 and the switch 42. The PMOS transistor 43 has its source and gate connected to the reset transistor 26 (FIG. 2) by the signal line 34 and its drain connected to the power supply VLOG. Also, the switch 42 is arranged in such a manner as to connect the signal line 34 and the power supply VR and opens and closes in accordance with the inverted enable signal XLOGEN, an inversion of the enable signal LOGEN that enables the readout of a logarithmic signal.

The logarithmic conversion circuit 32B is thus configured and can switch between linear mode and logarithmic mode seamlessly in accordance with the inverted enable signal XLOGEN when a pixel signal is read out from the pixel 12.

That is, in the case of linear mode, the switch 42 turns ON as a result of the inverted enable signal XLOGEN rising to high level, and the power supply VR is connected to the pixel 12 via the switch 42. As a result, a pixel signal that changes linearly in proportion to the amount of light received by the pixel 12 is read out. Also, in the case of logarithmic mode, the switch 42 turns OFF as a result of the inverted enable signal XLOGEN falling to low level, and the power supply VLOG is connected to the pixel 12 via the PMOS transistor 43. As a result, a pixel signal that changes logarithmically in proportion to the amount of light received by the pixel 12 is read out.

FIG. 4C illustrates a third circuit configuration example of the logarithmic conversion circuit 32.

As illustrated in FIG. 4C, a logarithmic conversion circuit 32C includes a combination of the NMOS transistor 41, the switch 42, and a switch 44. The NMOS transistor 41 has its source connected to the reset transistor 26 (FIG. 2) by the signal line 34 via the switch 44 and its drain and gate connected to the power supply VLOG. Also, the switch 42 is arranged in such a manner as to connect the signal line 34 and the power supply VR and opens and closes in accordance with the inverted enable signal XLOGEN, an inversion of the enable signal that enables the readout of a logarithmic signal.

The logarithmic conversion circuit 32C is thus configured and can switch between linear mode and logarithmic mode seamlessly in accordance with the enable signal LOGEN and the inverted enable signal XLOGEN when a pixel signal is read out from the pixel 12.

That is, in the case of linear mode, the switch 42 turns ON as a result of the inverted enable signal XLOGEN rising to high level, and on the other hand, the switch 44 turns OFF as a result of the enable signal LOGEN falling to low level. As a result, the power supply VR is connected to the pixel 12 via the switch 42, and a pixel signal that changes linearly in proportion to the amount of light received by the pixel 12 is read out. Also, in the case of logarithmic mode, the switch 42 turns OFF as a result of the inverted enable signal XLOGEN falling to low level, and on the other hand, the switch 44 turns ON as a result of the enable signal LOGEN rising to high level. As a result, the power supply VRLOG is connected to the pixel 12 via the diode-connected NMOS transistor 41, and a pixel signal that changes logarithmically in proportion to the amount of light received by the pixel 12 is read out.

FIG. 4D illustrates a fourth circuit configuration example of the logarithmic conversion circuit 32.

As illustrated in FIG. 4D, a logarithmic conversion circuit 32D includes a combination of the PMOS transistor 43, the switch 42, and the switch 44. The PMOS transistor 43 has its source and gate connected to the reset transistor 26 (FIG. 2) by the signal line 34 via the switch 44 and its drain connected to the power supply VLOG. Also, the switch 42 is arranged in such a manner as to connect the signal line 34 and the power supply VR and opens and closes in accordance with the inverted enable signal XLOGEN, an inversion of the enable signal LOGEN that enables the readout of a logarithmic signal. Also, the switch 44 is arranged in such a manner as to connect the NMOS 43 and the signal line 34 and opens and closes in accordance with the enable signal LOGEN that enables the readout of a logarithmic signal.

The logarithmic conversion circuit 32D is thus configured and can switch between linear mode and logarithmic mode seamlessly in accordance with the enable signal LOGEN and the inverted enable signal XLOGEN when a pixel signal is read out from the pixel 12.

That is, in the case of linear mode, the switch 42 turns ON as a result of the inverted enable signal XLOGEN rising to high level, and on the other hand, the switch 44 turns OFF as a result of the enable signal LOGEN falling to low level. As a result, the power supply VR is connected to the pixel 12 via the switch 42, and a pixel signal that changes linearly in proportion to the amount of light received by the pixel 12 is read out. Also, in the case of logarithmic mode, the switch 42 turns OFF as a result of the inverted enable signal XLOGEN falling to low level, and on the other hand, the switch 44 turns ON as a result of the enable signal LOGEN rising to high level. As a result, the power supply VLOG is connected to the pixel 12 via the diode-connected PMOS transistor 43, and a pixel signal that changes logarithmically in proportion to the amount of light received by the pixel 12 is read out.

It should be noted that although the logarithmic conversion circuit 32C illustrated in FIG. 4C is a configuration example in which the switch 44 is arranged on the source side of the NMOS transistor 41, a configuration may be used in which the switch 44 is arranged between the drain of the NMOS transistor 41 and the power supply VLOG. Also, the logarithmic conversion circuit 32A illustrated in FIG. 4A and the logarithmic conversion circuit 32C illustrated in FIG. 4C may be configured such that the body of the NMOS transistor 41 is connected not only to GND but also to the source.

Also, FIG. 5 illustrates a fifth circuit configuration example of the logarithmic conversion circuit 32.

As illustrated in FIG. 5, a logarithmic conversion circuit 32E includes a combination of two NMOS transistors 41-1 and 41-2, the switch 42, and two switches 44-1 and 44-2.

The NMOS transistor 41-1 has its source connected to the reset transistor 26 (FIG. 2) by the signal line 34 via the switch 44-1 and its drain and gate connected to the power supply VLOG. Similarly, the NMOS transistor 41-2 has its source connected to the reset transistor 26 (FIG. 2) by the signal line 34 via the switch 44-2 and its drain and gate connected to the power supply VLOG. Also, the switch 42 is arranged in such a manner as to connect the signal line 34 and the power supply VR and opens and closes in accordance with the inverted enable signal XLOGEN, an inversion of the enable signal LOGEN that enables the readout of a logarithmic signal.

Also, the switch 44-1 is arranged in such a manner as to connect the NMOS transistor 41-1 and the signal line 34 and opens and closes in accordance with a first enable signal LOGEN1 that enables the readout of a logarithmic signal. Similarly, the switch 44-2 is arranged in such a manner as to connect the NMOS transistor 41-2 and the signal line 34 and opens and closes in accordance with a second enable signal LOGEN2 that enables the readout of a logarithmic signal.

Because of the provision of the two NMOS transistors 41-1 and 41-2, the logarithmic conversion circuit 32E thus configured can change the dynamic range of the pixel signal read out from the pixel 12 by switching the switches 44-1 and 44-2. Also, the logarithmic conversion circuit 32E can include a trimming function to even out the diode characteristic with the NMOS transistors 41-1 and 41-2.

It should be noted that the logarithmic conversion circuit 32 is not limited to the circuit configurations as illustrated in FIGS. 4 and 5 and can use circuit configurations other than these. Also, the power supplies VR and VLOG may be not only different power supplies as illustrated but also the same power supply. Also, not only a two-stage configuration using the two NMOS transistors 41-1 and 41-2 as with the logarithmic conversion circuit 32E but also a multi-stage configuration using two or more NMOS transistors 41 may be used.

Then, the imaging device 11 can provide a higher degree of design freedom with respect to the size, type, and other features of the transistors included in the logarithmic conversion circuit 32 by using a configuration of arranging the logarithmic conversion circuit 32 in the circuit region 14 (i.e., outside the pixel region 13).

Figure 6:
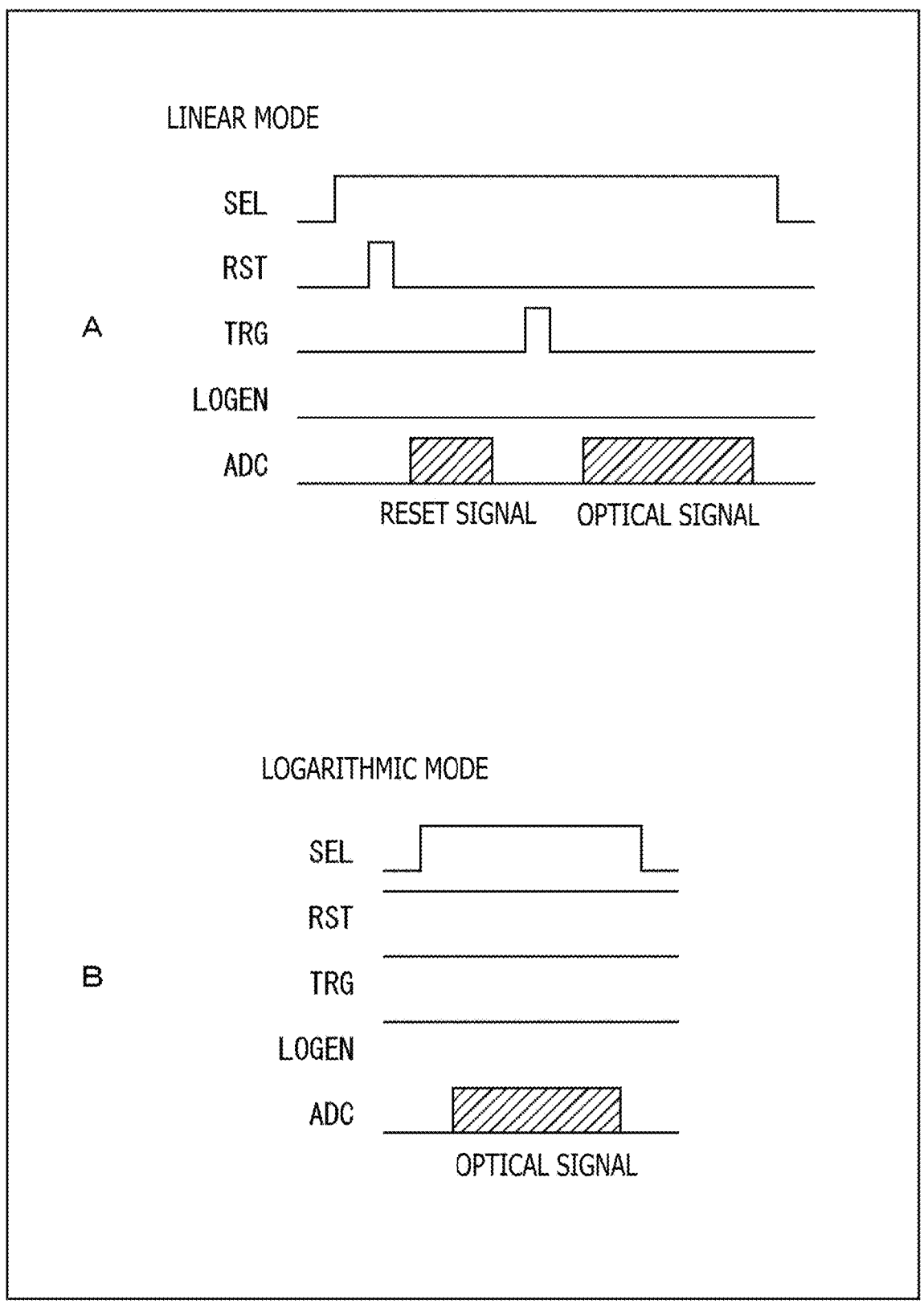
FIG. 6 depicts diagrams describing readout of a pixel signal from a pixel.

A description will be given next of the readout of a pixel signal from the pixel 12 with reference to FIG. 6.

FIG. 6A illustrates an example of a drive signal when a pixel signal is read out from the pixel 12 in linear mode, and FIG. 6B illustrates an example of a drive signal when a pixel signal is read out from the pixel 12 in logarithmic mode.

As illustrated in FIG. 6A, in the case of linear mode, the low-level enable signal LOGEN is supplied to the logarithmic conversion circuit 32, causing, for example, the switch 42 illustrated in FIG. 4C to turn ON (inverted enable signal XLOGEN at high level) and the switch 44 to turn OFF.

Then, in linear mode, the selection signal SEL rises to high level first, making it possible to output a pixel signal to the signal line 33 from the pixel 12. Next, the reset signal RST rises to high level in a pulse form, resetting the FD section 23, and the AD conversion circuit 31 reads out the pixel signal (reset signal) at reset level to proceed with AD conversion. Then, the transfer signal TRG rises to high level in a pulse form, transferring an electric charge from the photodiode 21 to the FD section 23, and the AD conversion circuit 31 reads out a pixel signal (optical signal) at a level proportional to the amount of light received by the photodiode 21 to proceed with AD conversion. After that, the selection signal SEL falls to low level, terminating the readout of a pixel signal from the pixel 12.

As illustrated in FIG. 6B, in the case of logarithmic mode, the high-level enable signal LOGEN is supplied to the logarithmic conversion circuit 32, causing, for example, the switch 42 illustrated in FIG. 4C to turn OFF (inverted enable signal XLOGEN at low level) and the switch 44 to turn ON. Also, in the case of logarithmic mode, the reset signal RST and the transfer signal TRG that are always at high level are supplied to the pixel 12.

In the logarithmic mode, therefore, while the selection signal SEL is at high level, an electric charge continues to be transferred to the FD section 23 from the photodiode 21. As a result, the electric charge converted from light by the photodiode 21 flows into the diode-connected transistor (e.g., NMOS transistor 41 in FIG. 4A, PMOS transistor 43 in FIG. 4B) via the FD section 23, allowing for readout of a pixel signal that changes logarithmically.

A description will be given next of modification examples of the pixel 12 with reference to FIG. 7.

Figure 7:
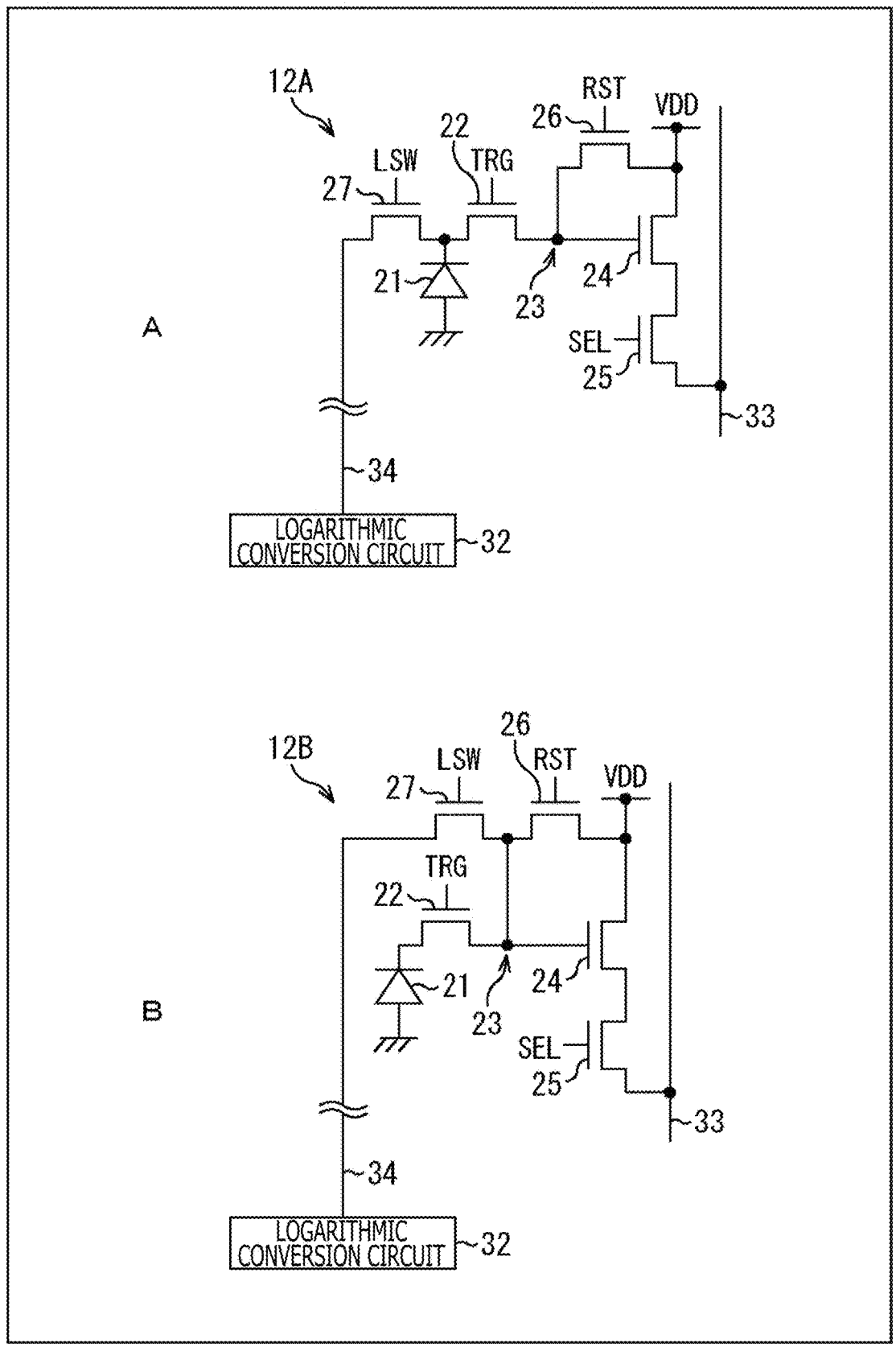
FIG. 7 depicts diagrams illustrating modification examples of a pixel.

FIG. 7A illustrates a first modification example of the pixel 12, and FIG. 7B illustrates a second modification example of the pixel 12. In pixels 12A and 12B illustrated in FIG. 7, the components common to those of the pixel 12 illustrated in FIG. 2 are denoted by the same reference numerals, and the detailed description thereof will be omitted.

As illustrated in FIG. 7A, the pixel 12A has a configuration common to the pixel 12 illustrated in FIG. 2 in that it includes the transfer transistor 22, the FD section 23, the amplifying transistor 24, the selection transistor 25, and the reset transistor 26.

Then, the pixel 12A has a configuration different from the pixel 12 in that the reset transistor 26 is connected to a power supply VDD and that the cathode terminal of the photodiode 21 is connected to the logarithmic conversion circuit 32 via a logarithmic switching transistor 27. The logarithmic switching transistor 27 is driven in accordance with a logarithmic switching signal LSW, and when the transfer transistor 22 turns ON together with the logarithmic switching transistor 27, the FD section 23 is connected to the logarithmic conversion circuit 32.

As illustrated in FIG. 7B, the pixel 12B has a configuration common to the pixel 12 illustrated in FIG. 2 in that it includes the photodiode 21, the transfer transistor 22, the FD section 23, the amplifying transistor 24, the selection transistor 25, and the reset transistor 26.

Then, the pixel 12B has a configuration different from the pixel 12 illustrated in FIG. 2 in that the reset transistor 26 is connected to the power supply VDD and that the FD section 23 is connected to the logarithmic conversion circuit 32 via the logarithmic switching transistor 27. The logarithmic switching transistor 27 is driven in accordance with a logarithmic switching signal LSW and is configured such that when the logarithmic switching transistor 27 turns ON, the FD section 23 is connected to the logarithmic conversion circuit 32.

With the pixels 12A and 12B thus configured, it is also possible to switch between linear readout and logarithmic readout seamlessly using the logarithmic conversion circuit 32 without changing the pixel properties of the pixels 12A and 12B by the logarithmic conversion circuit 32 as with the pixel 12 illustrated in FIG. 2.

Figure 8:
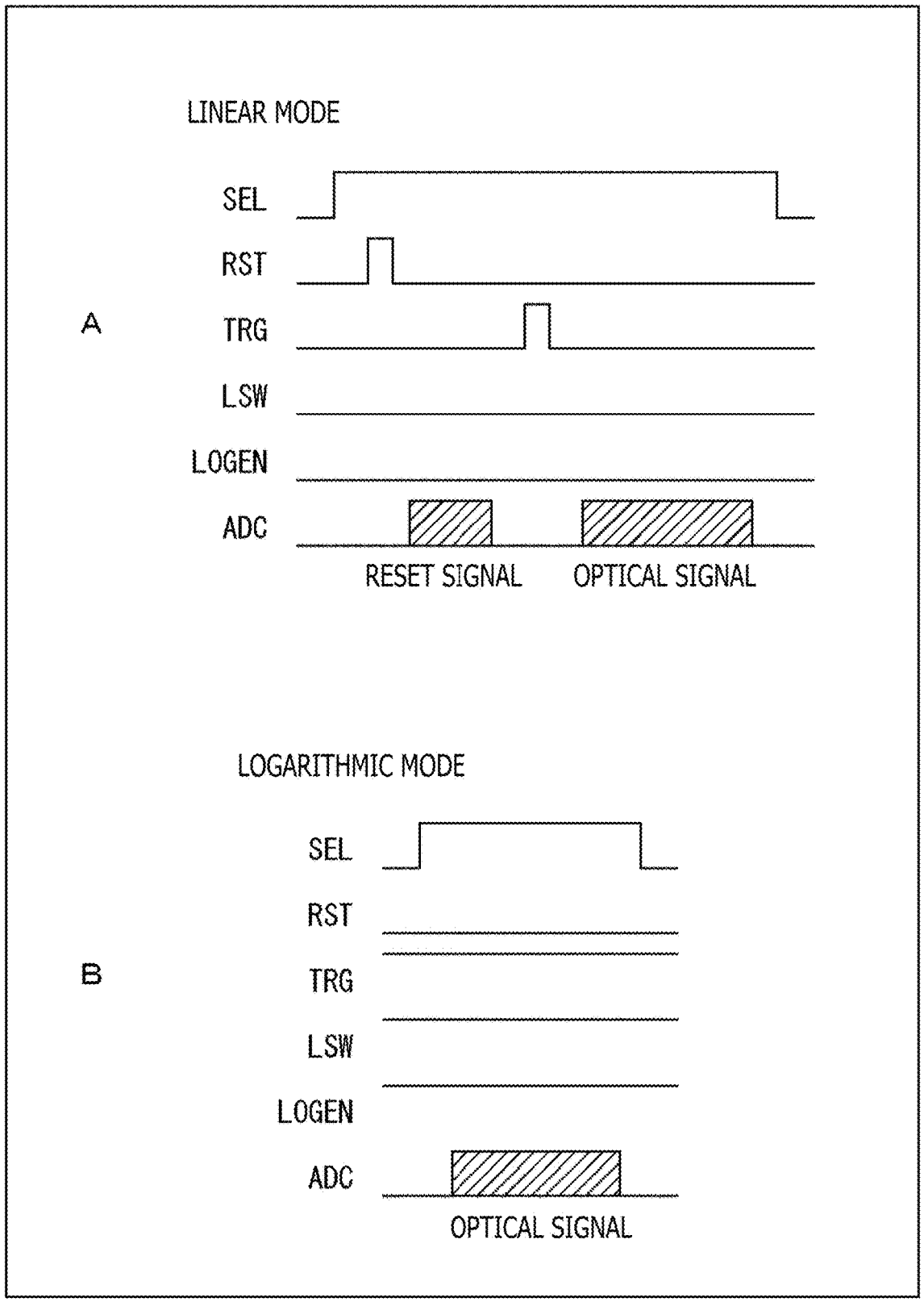
FIG. 8 depicts diagrams describing readout of a pixel signal from the pixel illustrated in FIGS. 7A and 7B.

A description will be given next of pixel signal readout corresponding to the pixels 12A and 12B with reference to FIG. 8.

FIG. 8A illustrates an example of a drive signal when a pixel signal is read out from the pixels 12A and 12B in linear mode, and FIG. 8B illustrates an example of a drive signal when a pixel signal is read out from the pixels 12A and 12B in logarithmic mode.

As illustrated in FIG. 8A, in the case of linear mode, the low-level logarithmic switching signal LSW is supplied to the logarithmic switching transistor 27, causing the logarithmic switching transistor 27 to turn OFF. Then, in the case of linear mode, pixel signals are read out from the pixels 12A and 12B as a result of driving similar to that described with reference to FIG. 6A.

As illustrated in FIG. 8B, in the case of logarithmic mode, the high-level logarithmic switching signal LSW is supplied to the logarithmic switching transistor 27, causing the logarithmic switching transistor 27 to turn ON. Then, in linear mode, pixel signals are read out from the pixels 12A and 12B as a result of driving similar to that described with reference to FIG. 6B.

Figure 9:
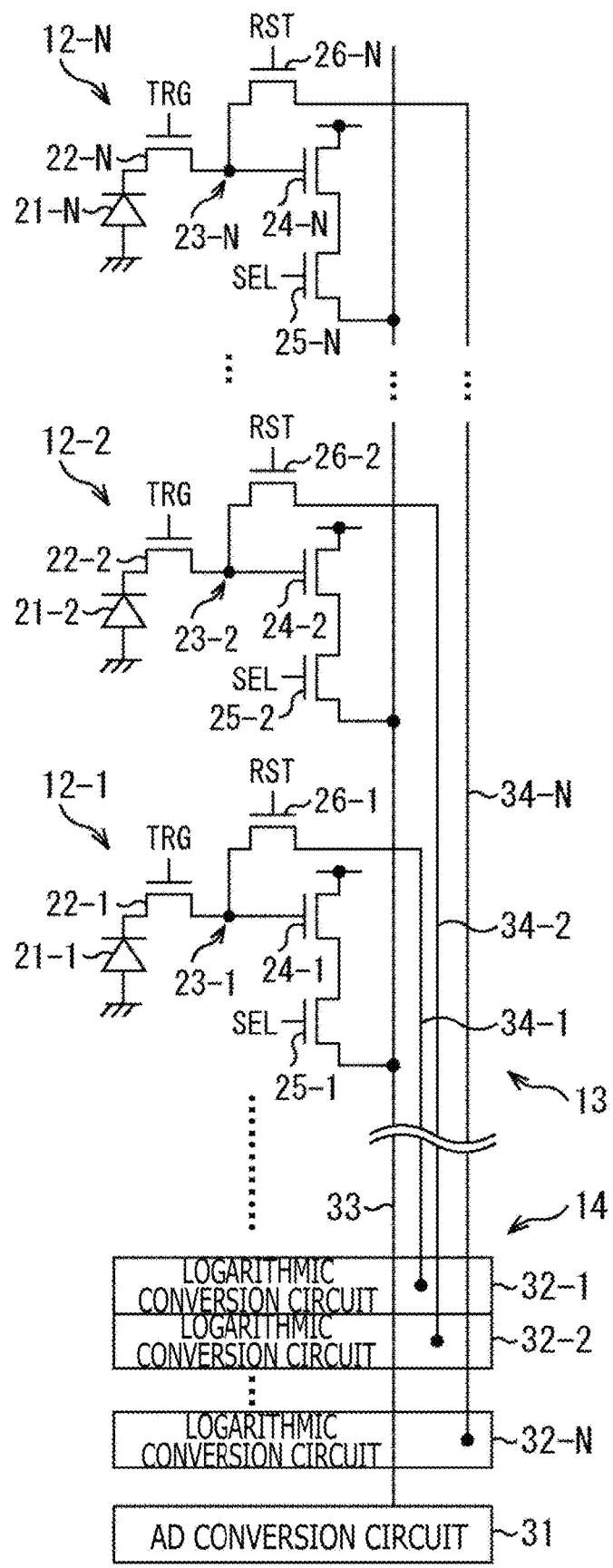
FIG. 9 is a diagram illustrating a first arrangement example of a logarithmic conversion circuit for a column of pixels.

Next, FIG. 9 is a diagram illustrating a first arrangement example of the logarithmic conversion circuit 32 for a column of the pixels 12 that are arranged in an array in the pixel region 13.

In the first arrangement example illustrated in FIG. 9, the plurality of logarithmic conversion circuits 32 are provided, for a column of the pixels 12, in numbers proportional to the number of pixels 12 arranged in that column. That is, the imaging device 11 can be configured such that N pixels 12-1 to 12-N provided in a column in the pixel region 13 are switched between linear mode and logarithmic mode by N logarithmic conversion circuits 32-1 to 32-N.

Thus, in the imaging device 11 having one logarithmic conversion circuit 32 for each of the pixels 12, it is possible to switch between linear mode and logarithmic mode for each of the pixels 12.

Figure 10:
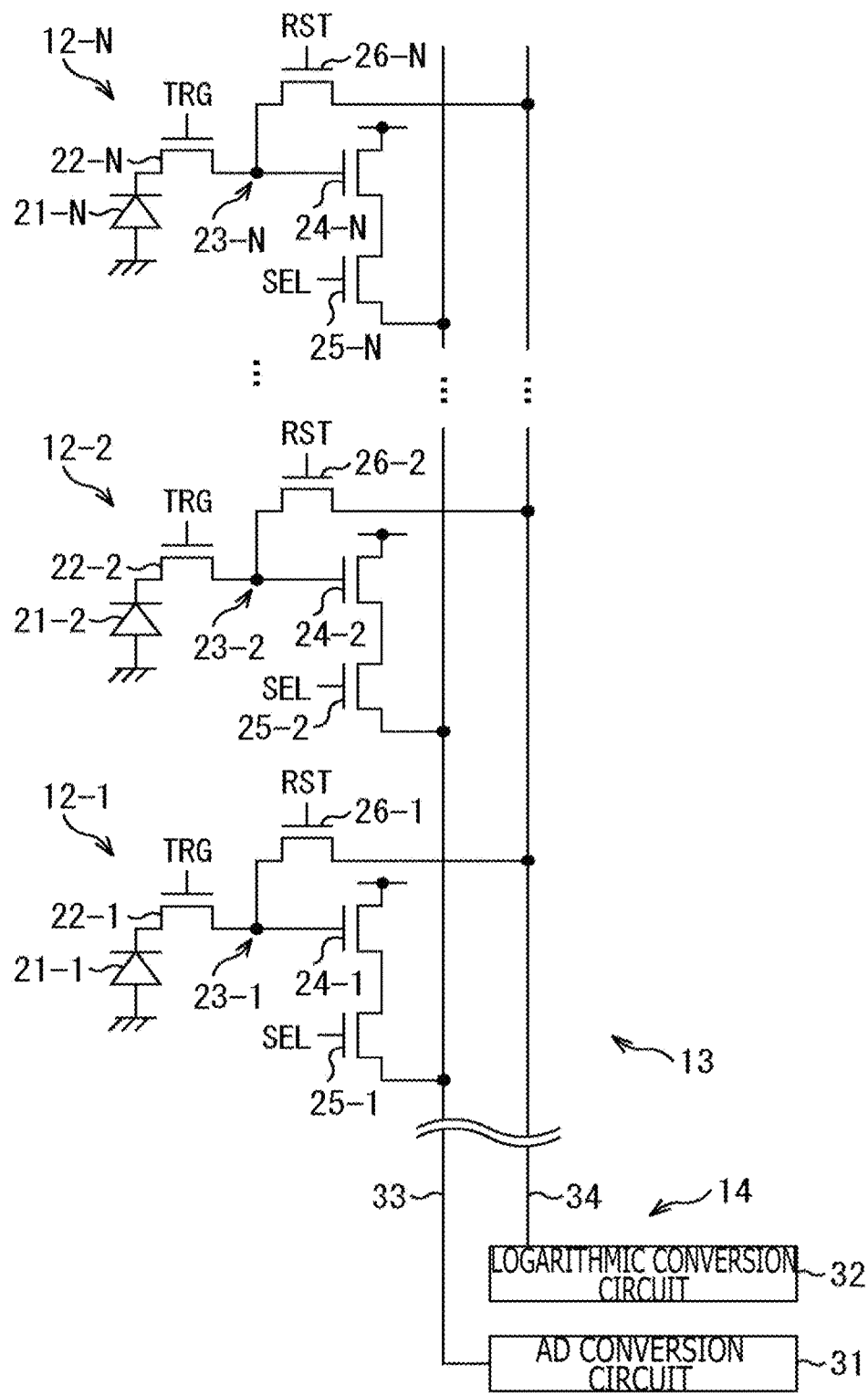
FIG. 10 is a diagram illustrating a second arrangement example of a logarithmic conversion circuit for a column of pixels.

FIG. 10 is a diagram illustrating a second arrangement example of the logarithmic conversion circuit 32 for a column of the pixels 12 that are arranged in an array in the pixel region 13.

In the second arrangement example illustrated in FIG. 10, one logarithmic conversion circuit 32 is arranged for each column of the pixels 12. That is, the imaging device 11 can be configured such that the N pixels 12-1 to 12-N provided in a column in the pixel region 13 are switched between linear mode and logarithmic mode by the single logarithmic conversion circuit 32.

Thus, in the imaging device 11 having one logarithmic conversion circuit 32 for a column of the pixels 12-1 to 12-N, it is possible to switch between linear mode and logarithmic mode for each column.

It should be noted that other arrangement examples as illustrated in FIGS. 9 and 10 may be used such as that in which, of the plurality of pixels 12 arranged in a column, one logarithmic conversion circuit 32 is arranged for every given number of pixels 12. In this case, it is possible to switch between linear mode and logarithmic mode for every given number of pixels 12.

Also, when, of a given number of the pixels 12 connected to one logarithmic conversion circuit 32, one pixel 12 is connected, a pixel signal can be logarithmically converted, and, on the other hand, when the plurality of pixels 12 are connected, optical signals can be added. For example, connection of the pixel 12 means a state of turning ON the transfer transistor 22 and the reset transistor 26, a state of turning ON only the logarithmic switching transistor 27, a state of turning ON the logarithmic switching transistor 27 and the transfer transistor 22, and so on. That is, it indicates the connection between the photodiode 21 and the logarithmic conversion circuit 32.

Here, the imaging device 11 can employ a laminated structure having, for example, the pixel region 13 and the circuit region 14 on different substrates and connecting the substrates together using TSV (Through-Silicon Via), micro bumps, Cu—Cu connection, and so on.

Figure 11:
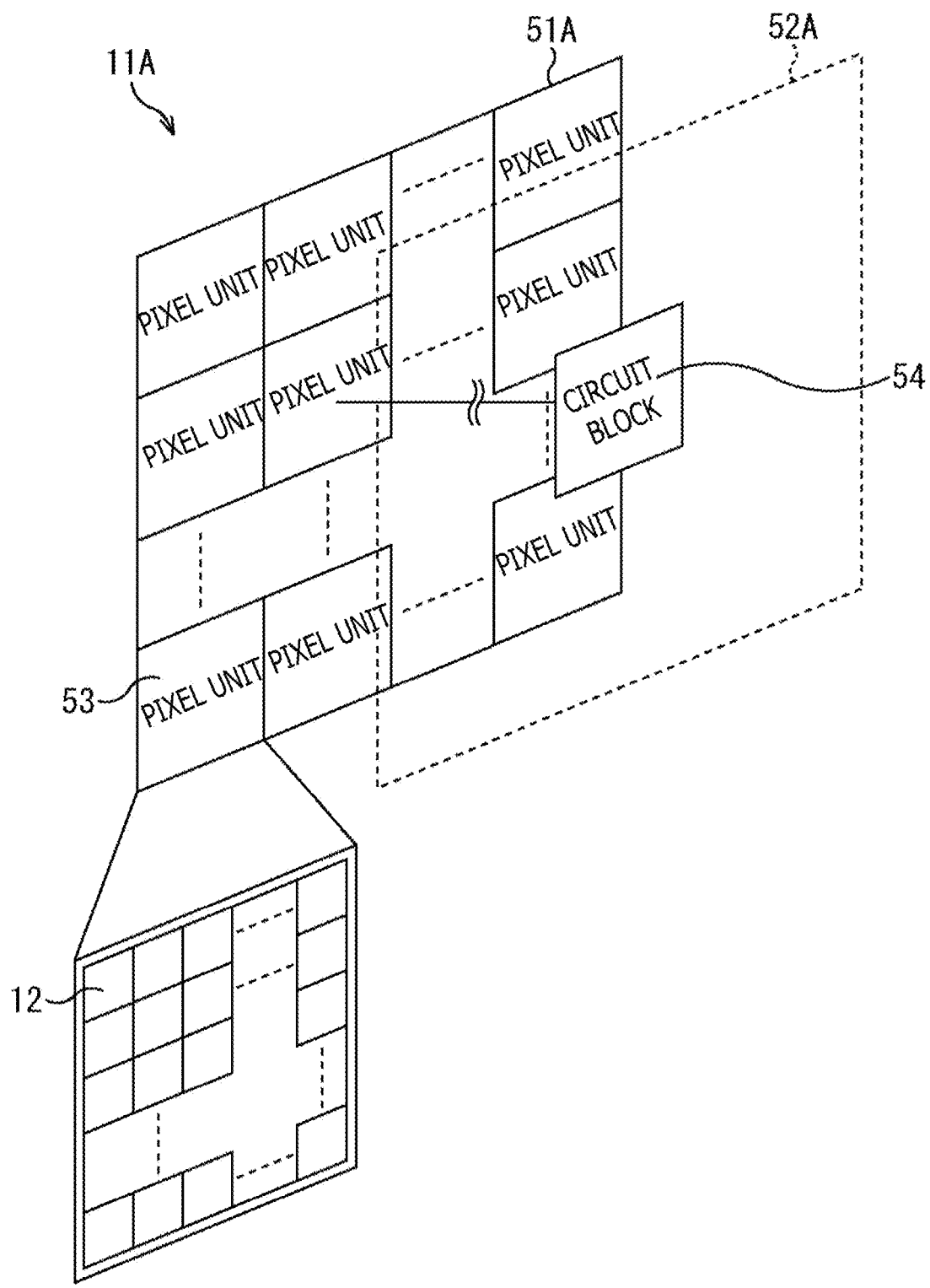
FIG. 11 is a diagram illustrating a first configuration example of an imaging device employing a laminated structure.

Next, FIG. 11 is a diagram illustrating a first configuration example of the imaging device 11 employing a laminated structure.

As illustrated in FIG. 11, an imaging device 11A includes a pixel substrate 51A and a circuit substrate 52A that are laminated one on top of the other. The plurality of pixels 12 are arranged in an array on the pixel substrate 51A as with the imaging device 11 illustrated in FIG. 1, and a pixel unit 53 includes a given number of pixels 12 as illustrated at bottom left. Circuit blocks 54 are provided in the circuit substrate 52A, one for each of the pixel units 53 of the pixel substrate 51A, and the circuit block 54 can include only the logarithmic conversion circuit 32. Alternatively, the circuit block 54 may include the AD conversion circuit 31 and the logarithmic conversion circuit 32 corresponding to the pixel unit 53.

The imaging device 11A thus configured can switch between linear mode and logarithmic mode for each of the pixel units 53 using the logarithmic conversion circuit 32 provided in the circuit block 54.

Figure 12:
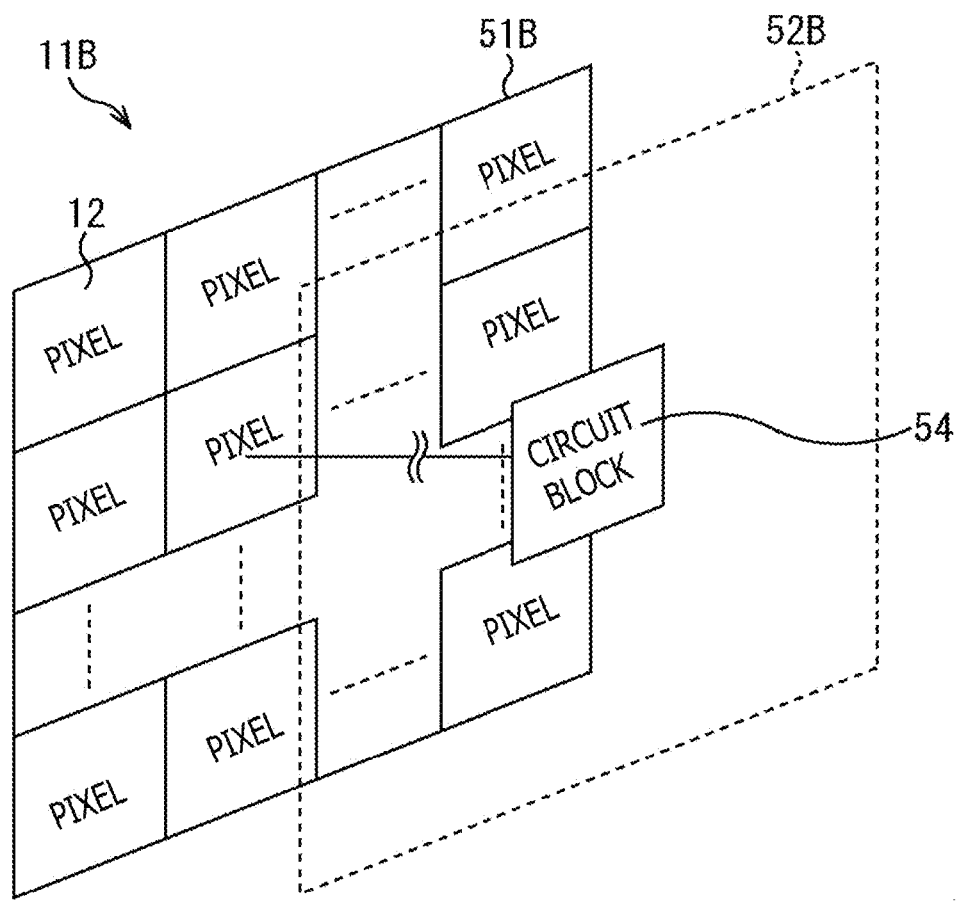
FIG. 12 is a diagram illustrating a second configuration example of an imaging device employing a laminated structure.

Next, FIG. 12 is a diagram describing a second configuration example of the imaging device 11 employing a laminated structure.

As illustrated in FIG. 12, an imaging device 11B includes a pixel substrate 51B and a circuit substrate 52B that are laminated one on top of another. The plurality of pixels 12 are arranged in an array on the pixel substrate 51B as with the imaging device 11 illustrated in FIG. 1. The circuit blocks 54 are provided in the circuit substrate 52B, one for each of the pixels 12 of the pixel substrate 51B.

The imaging device 11B thus configured can switch between linear mode and logarithmic mode for each of the pixels 12 using the logarithmic conversion circuit 32 provided in the circuit block 54. It should be noted that the imaging device 11 may include two or more layers that are laminated one on top of the others. Also, the imaging device 11 may be configured such that, in such a laminated structure, the logarithmic conversion circuits 32 are formed, for example, in a peripheral portion of a pixel substrate 51, a region outside the pixel region 13 where the pixels 12 are formed.

A description will be given here of a configuration example of the pixel 12 and the circuit block 54 in a configuration having the circuit block 54 for each of the pixels 12 with reference to FIG. 13.

For example, as illustrated in FIG. 13A, the pixel 12A can be configured similarly to the pixel 12 illustrated in FIG. 2, and a circuit block 54A can include only the logarithmic conversion circuit 32.

Also, as illustrated in FIG. 13B, the pixel 12B can be configured similarly to the pixel 12 illustrated in FIG. 2, and a circuit block 54B can include the AD conversion circuit 31 and the logarithmic conversion circuit 32.

Also, as illustrated in FIG. 13C, a pixel 12C can include the photodiode 21, the transfer transistor 22, the FD section 23, the amplifying transistor 24, and the selection transistor 25, and a circuit block 54C can include the AD conversion circuit 31, the logarithmic conversion circuit 32, and the reset transistor 26.

Also, as illustrated in FIG. 13D, a pixel 12D can include the photodiode 21, the transfer transistor 22, and the FD section 23, and a circuit block 54D can include the AD conversion circuit 31, the logarithmic conversion circuit 32, the amplifying transistor 24, the selection transistor 25, and the reset transistor 26.

Also, as illustrated in FIG. 13E, a pixel 12E can include the photodiode 21, the transfer transistor 22, and the FD section 23, the amplifying transistor 24, and the reset transistor 26, and a circuit block 54E can include the AD conversion circuit 31, the logarithmic conversion circuit 32, and the selection transistor 25.

Figure 13:
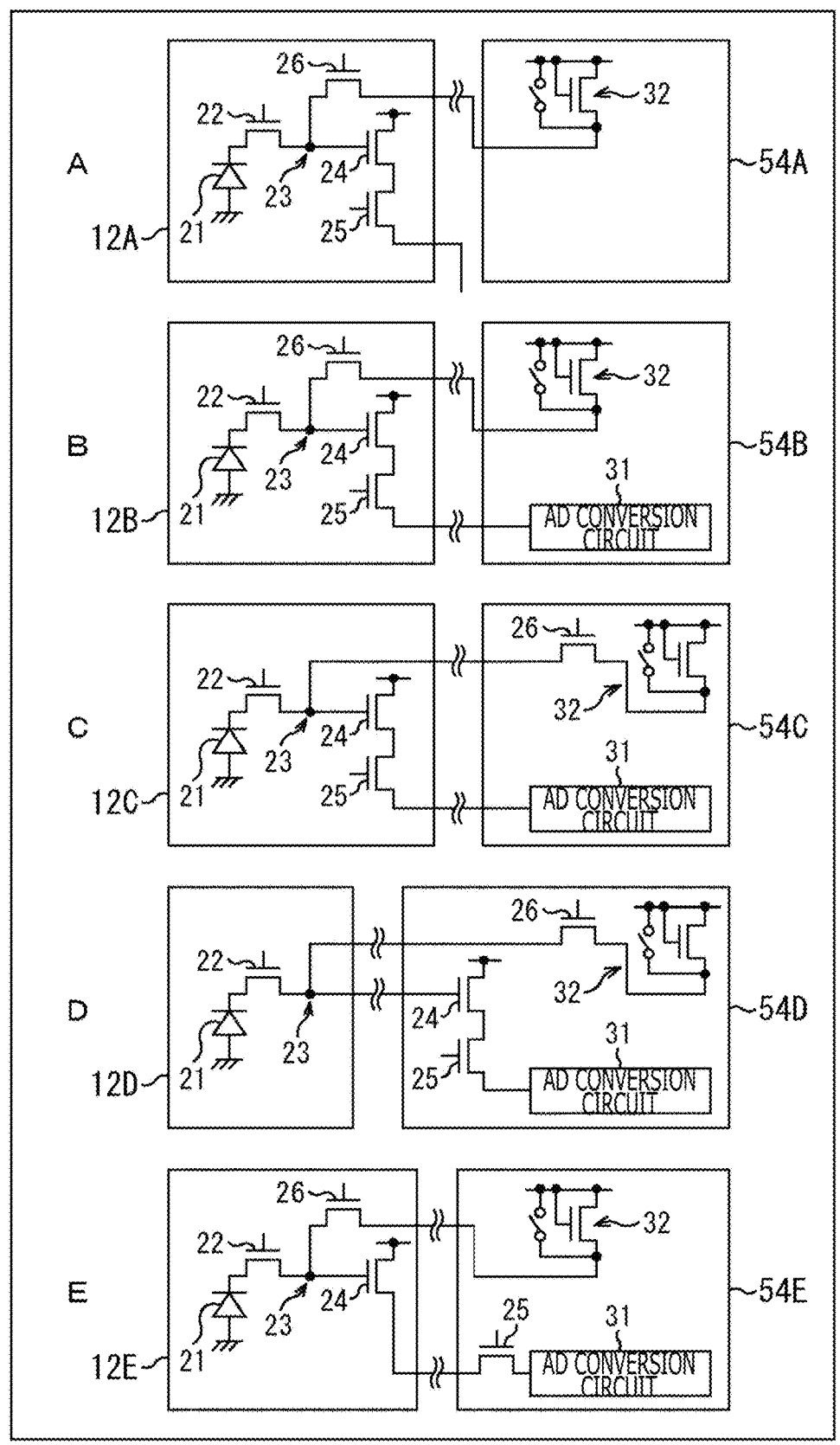
FIG. 13 depicts diagrams illustrating configuration examples of a pixel and a circuit block.

Thus, in the configuration having the circuit block 54 for each of the pixels 12, each of elements included in the pixels 12 and the circuit blocks 54 can be arranged properly, and arrangement other than those illustrated in FIG. 13 may also be used.

Figure 14:
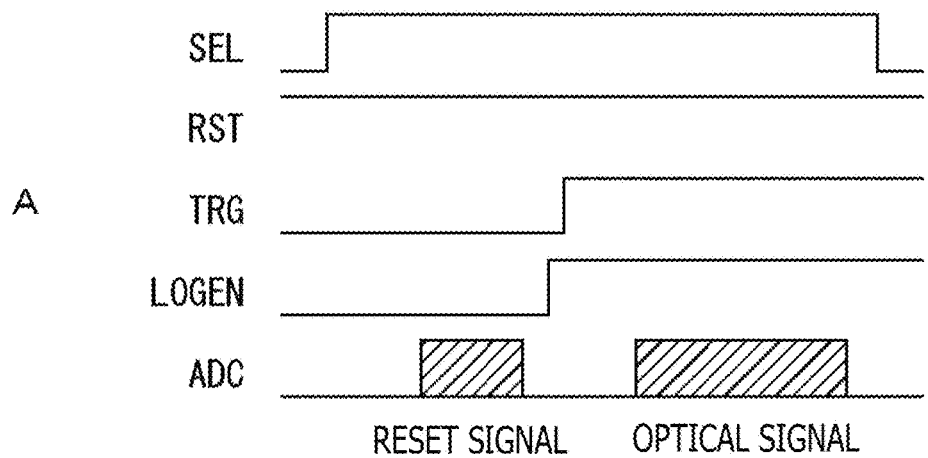
FIG. 14 depicts diagrams describing modification examples of a logarithmic mode readout scheme.
Figure 14:
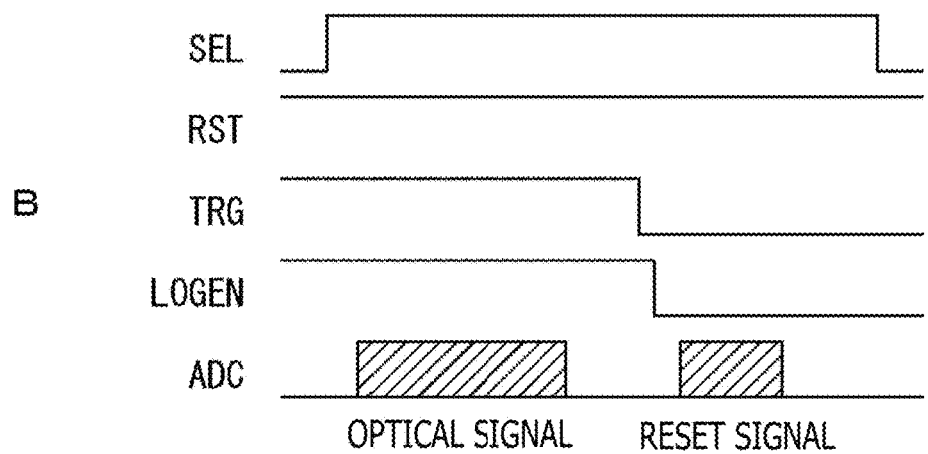

A description will be given next of a modification example of a logarithmic mode readout scheme with reference to FIG. 14.

FIG. 14A illustrates a first modification example of the logarithmic mode readout scheme. That is, a reset signal is output when the enable signal LOGEN is at low level, and an optical signal is logarithmically output when the enable signal LOGEN is at high level. For this reason, as illustrated in FIG. 14A, driving can be achieved by the logarithmic mode readout scheme that reads out a reset signal first and then reads out a logarithmic signal as an optical signal. By using the logarithmic mode readout scheme as illustrated in FIG. 14A, it is possible to realize CDS (Correlated Double Sampling) that eliminates noise (including offset) from the drain-grounded circuit that is used to read out the pixel signal.

FIG. 14B illustrates a second modification example of the logarithmic mode readout scheme. By using the logarithmic mode readout scheme as illustrated in FIG. 14B, it is possible to eliminate a circuit offset by subtracting outputs (analog region, digital region, or both thereof).

For example, as depicted in FIG. 9, a description will be given next of a pixel signal readout scheme in the imaging device 11 having, for a column of the pixels 12, the plurality of logarithmic conversion circuits 32 in numbers proportional to the number of pixels 12 arranged in that column with reference to FIG. 15.

Figure 15:
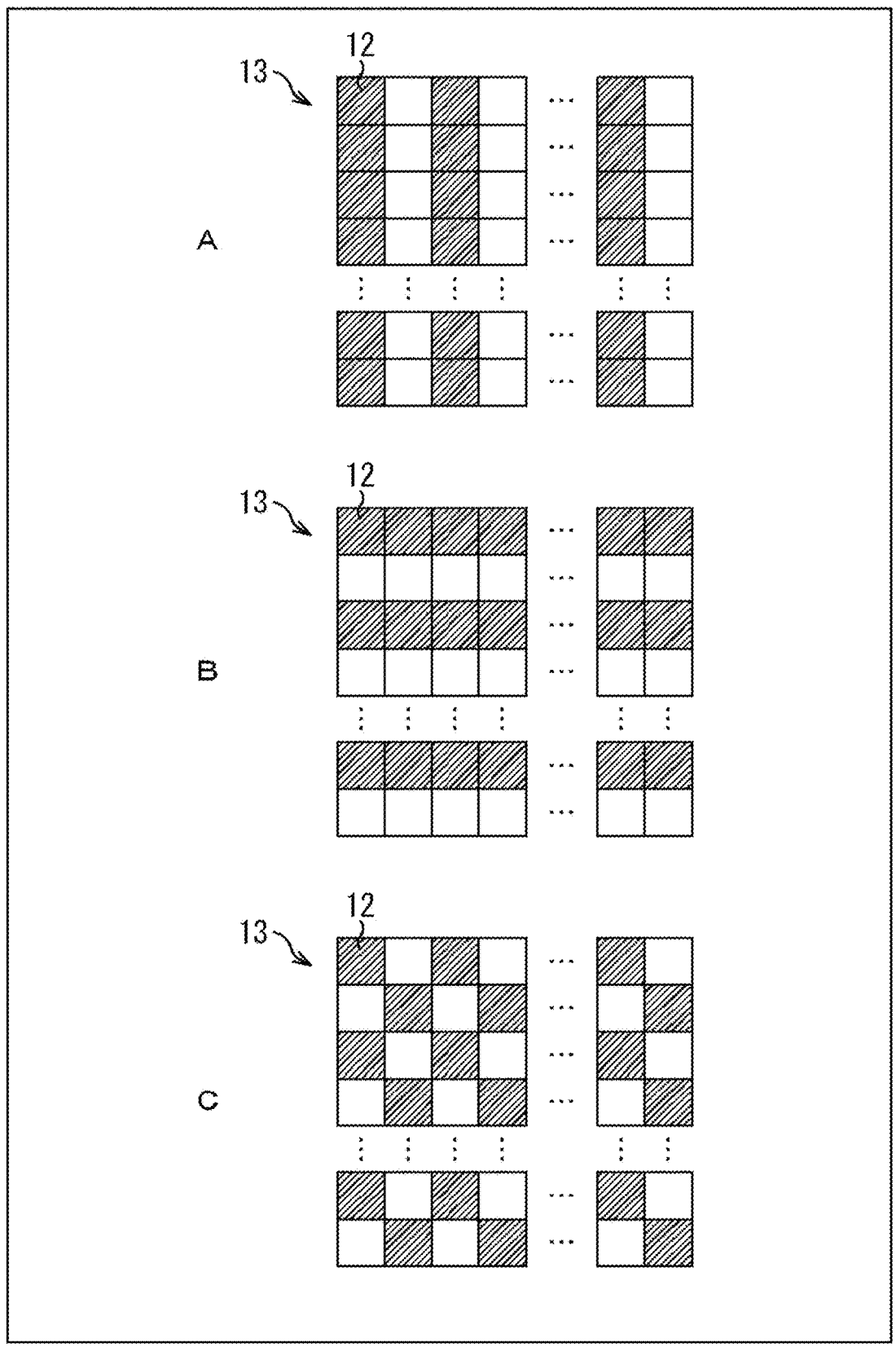
FIG. 15 depicts diagrams describing a pixel signal readout scheme.

In FIG. 15, of the plurality of pixels 12 arranged in the pixel region 13, those pixels 12 from which pixel signals are read out in linear mode are not hatched, and those pixels 12 from which pixel signals are read out in logarithmic mode are hatched.

For example, as illustrated in FIG. 15A, it is possible to read out pixel signals by using a readout scheme that arranges the pixels 12 from which pixel signals are read out in linear mode and the pixels 12 from which pixel signals are read out in logarithmic mode column by column through the pixels 12.

Also, as illustrated in FIG. 15B, it is possible to read out pixel signals by using a readout scheme that arranges the pixels 12 from which pixel signals are read out in linear mode and the pixels 12 from which pixel signals are read out in logarithmic mode row by row through the pixels 12.

Also, as illustrated in FIG. 15C, it is possible to read out pixel signals by using a readout scheme that arranges the pixels 12 from which pixel signals are read out in linear mode and the pixels 12 from which pixel signals are read out in logarithmic mode in a checkered pattern (i.e., the pixels 12 alternate column by column and row by row). Such a readout scheme is known to provide improved spatial frequency.

Thus, by mixing the pixels 12 from which pixel signals are read out in linear mode and the pixels 12 from which pixel signals are read out in logarithmic mode, it is possible to acquire an image with wide dynamic range and an image with low noise at the same timing. For example, the imaging device 11 may use these two images as independent images or can acquire an image with low noise and wide dynamic range by combining the two images. It should be noted that the readout scheme described with reference to FIG. 15 can be realized by configuring the imaging device 11 such that pixel signals can be read out from all the pixels 12 in linear mode or logarithmic mode and is an application example of the imaging device 11 configured in such a manner.

Figure 16:
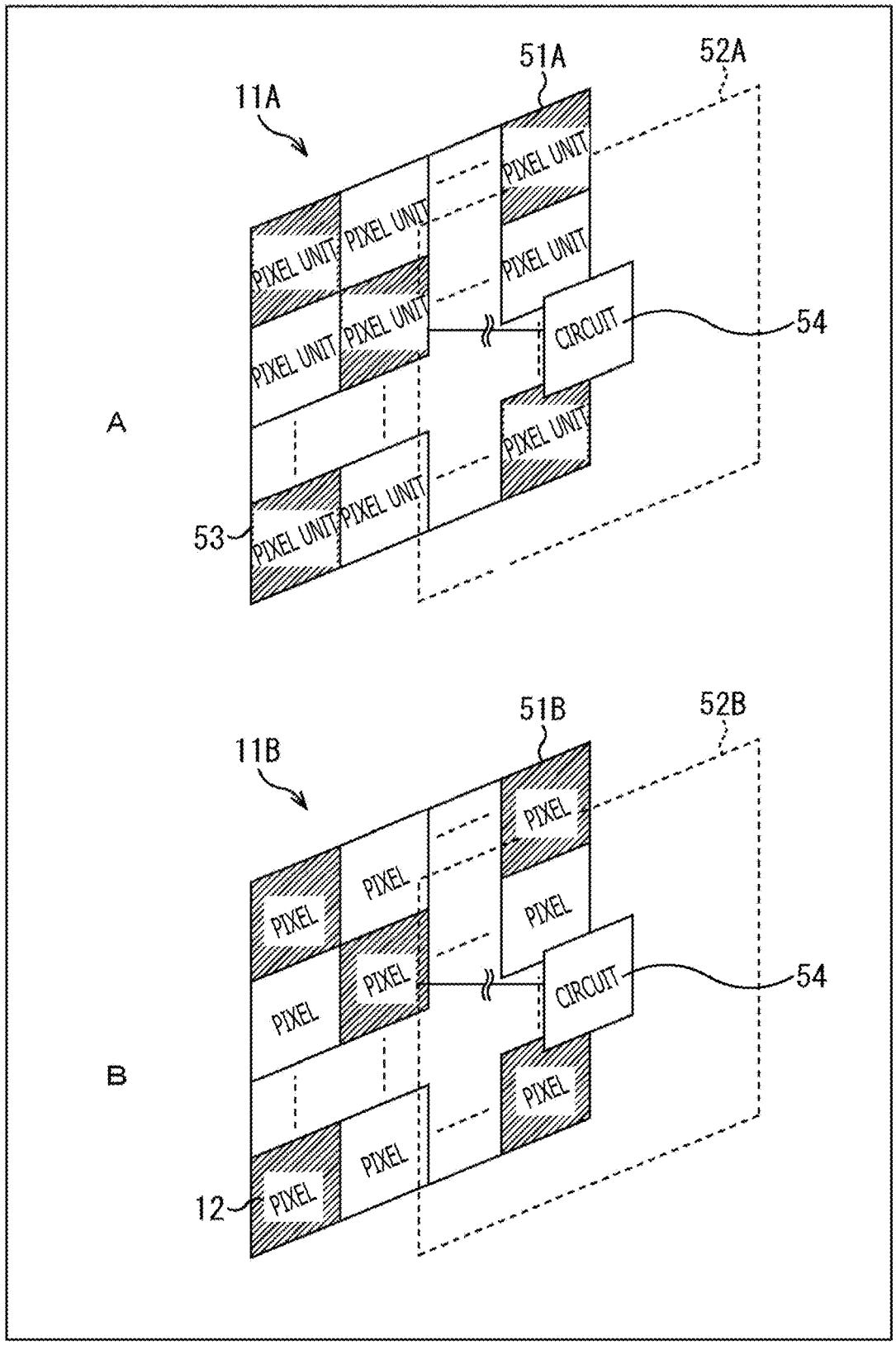
FIG. 16 depicts diagrams describing the pixel signal readout scheme.

A description will be given next of the pixel signal readout scheme in the imaging devices 11A and 11B illustrated in FIG. 11 with reference to FIG. 16.

In FIG. 16A, of the plurality of pixel units 53 arranged in the imaging device 11A, those pixel units 53 from which pixel signals are read out in linear mode are not hatched, and those pixel units 53 from which pixel signals are read out in logarithmic mode are hatched.

As illustrated in FIG. 16A, in the imaging device 11A, pixel signals can be read out by using a readout scheme that arranges the pixel units 53 from which pixel signals are read out in linear mode and the pixel units 53 from which pixel signals are read out in logarithmic mode in a checkered pattern (i.e., the pixel units 53 alternate column by column and row by row).

Thus, by mixing the pixel units 53 from which pixel signals are read out in linear mode and the pixel units 53 from which pixel signals are read out in logarithmic mode, it is possible to acquire an image with wide dynamic range and an image with low noise at the same timing. For example, the imaging device 11 may use these two images as independent images or can acquire an image with low noise and wide dynamic range by combining the two images.

Further, for example, a readout scheme may also be used that arranges the pixel units 53 from which pixel signals are read out in linear mode and the pixel units 53 from which pixel signals are read out in logarithmic mode regularly (i.e., column by column or row by row) or randomly. Also, in addition to a configuration of reading out pixel signals only in linear mode or logarithmic mode, pixel signals may be read out by combining linear mode and logarithmic mode. It should be noted that the readout schemes as described here can be realized by configuring the imaging device 11A such that pixel signals can be read out from all the pixels 12 in linear mode or logarithmic mode and are application examples of the imaging device 11A configured in such a manner.

In FIG. 16B, of the plurality of pixels 12 arranged in the imaging device 11B, those pixels 12 from which pixel signals are read out in linear mode are not hatched, and those pixels 12 from which pixel signals are read out in logarithmic mode are hatched.

As illustrated in FIG. 16B, in the imaging device 11B, pixel signals can be read out by using a readout scheme that arranges the pixels 12 from which pixel signals are read out in linear mode and the pixels 12 from which pixel signals are read out in logarithmic mode in a checkered pattern (i.e., the pixels 12 alternate column by column and row by row).

Thus, by mixing the pixels 12 from which pixel signals are read out in linear mode and the pixels 12 from which pixel signals are read out in logarithmic mode, it is possible to acquire an image with wide dynamic range and an image with low noise at the same timing. For example, the imaging device 11 may use these two images as independent images or can acquire an image with low noise and wide dynamic range by combining the two images.

Further, for example, a readout scheme may also be used that arranges the pixels 12 from which pixel signals are read out in linear mode and the pixels 12 from which pixel signals are read out in logarithmic mode regularly (i.e., column by column or row by row) or randomly. It should be noted that the readout schemes as described here can be realized by configuring the imaging device 11B such that pixel signals can be read out from all the pixels 12 in linear mode or logarithmic mode and are application examples of the imaging device 11B configured in such a manner.

It should be noted that in each of the readout schemes as described above, the pixels 12 (or the pixel units 53) from which pixel signals are read out in linear mode and the pixels 12 (or the pixel units 53) from which pixel signals are read out in logarithmic mode may be switched, for example, frame by frame.

For example, by taking advantage of seamless switching between linear mode and logarithmic mode, it is possible to perform control such that pixel signals are read out in logarithmic mode during automatic exposure operation for image capture and such that logarithmic mode is switched over to linear mode to read out pixel signals during image capture. With such control, logarithmic mode is optimal for determining optimal exposure conditions because of wide dynamic range, and linear mode is suitable as a shooting mode because of its low noise.

A description will be given next of a configuration example using the pixels 12 having a pixel sharing structure with reference to FIGS. 17 and 18.

Figure 17:
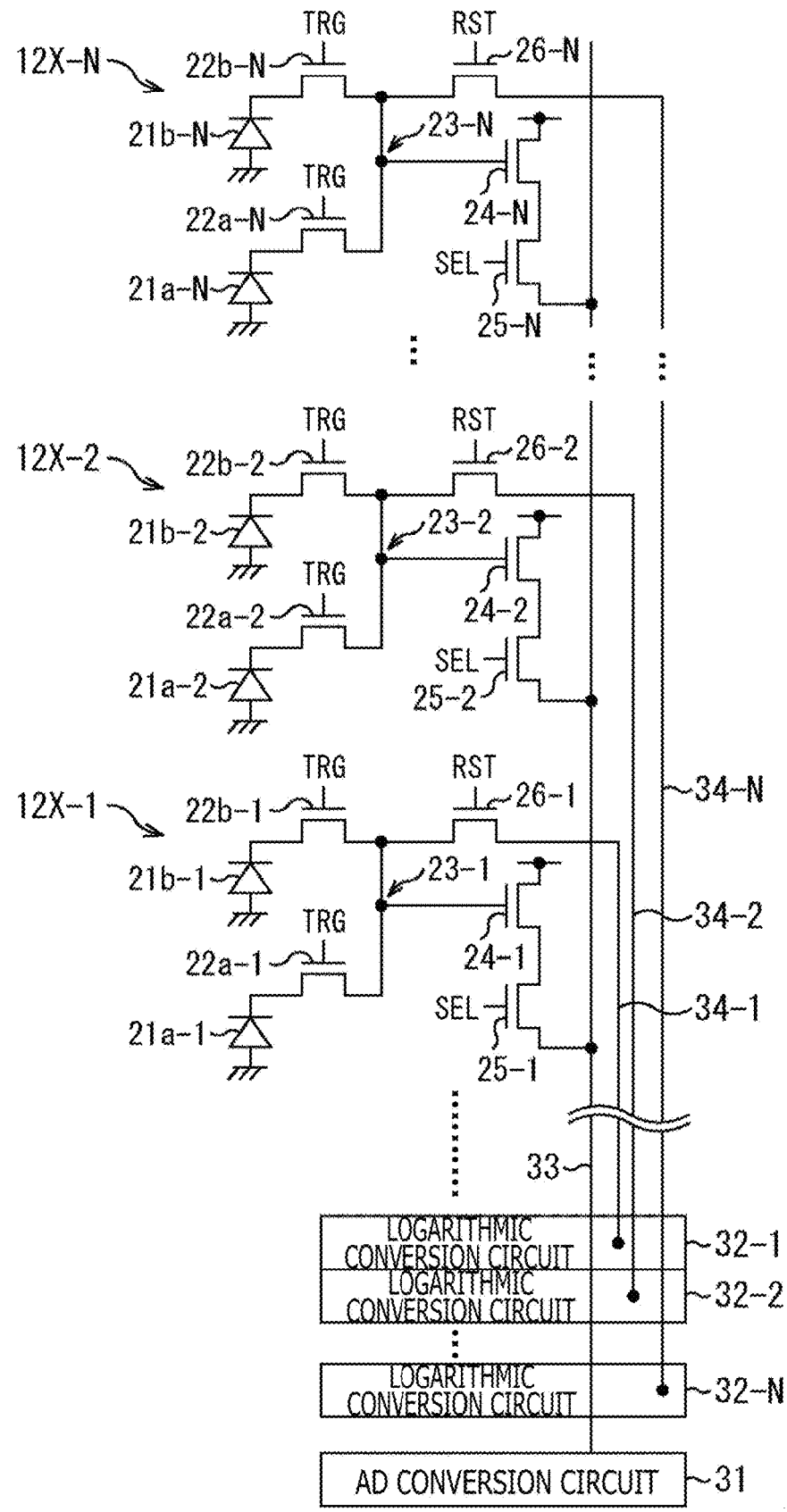
FIG. 17 is a diagram illustrating a configuration example of pixels having a pixel sharing structure.

Pixels 12X illustrated in FIG. 17 have a two-pixel sharing structure in which two photodiodes 21a and 21b share the FD section 23, the amplifying transistor 24, the selection transistor 25, and the reset transistor 26. Then, the plurality of logarithmic conversion circuits 32 are provided, for a column of the pixels 12X, in numbers proportional to the number of pixels 12X arranged in that column. That is, N pixels 12X-1 to 12X-N provided in a column in the pixel region 13 are switched between linear mode and logarithmic mode respectively by the N logarithmic conversion circuits 32-1 to 32-N.

Figure 18:
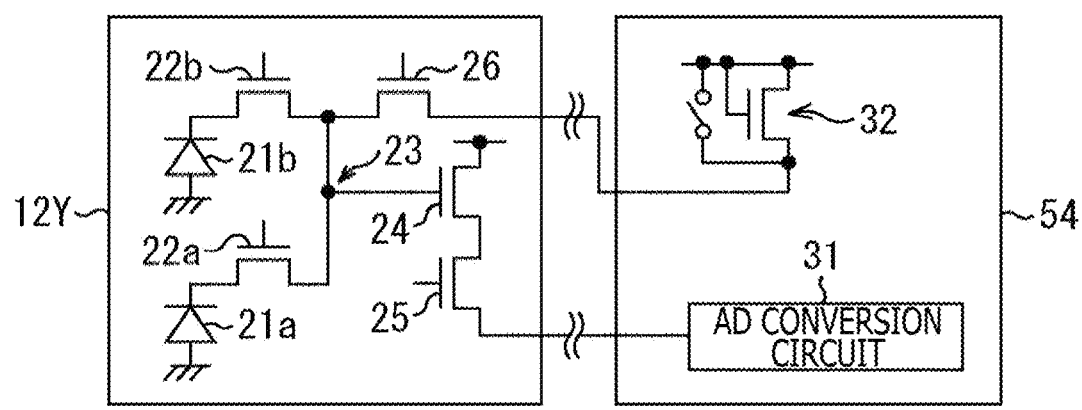
FIG. 18 is a diagram illustrating a configuration example of pixels having a pixel sharing structure.

Also, a pixel 12Y illustrated in FIG. 18 has a two-pixel sharing structure as do the pixels 12X illustrated in FIG. 17. Then, as with the laminated structure described above with reference to FIG. 12, a configuration can be used in which the circuit block 54 having the logarithmic conversion circuit 32 is provided for each of the pixels 12Y arranged in the pixel substrate 51 in the circuit substrate 52.

Thus, further miniaturization can be achieved by using the pixels 12X and 12Y having a two-pixel sharing structure. Of course, by using four-pixel and eight-pixel sharing structures, it is possible to employ a configuration having one logarithmic conversion circuit 32 for each of these structures.

A description will be given next of another example of sharing the logarithmic conversion circuit 32 among the plurality of pixels 12 with reference to FIG. 19.

Figure 19:
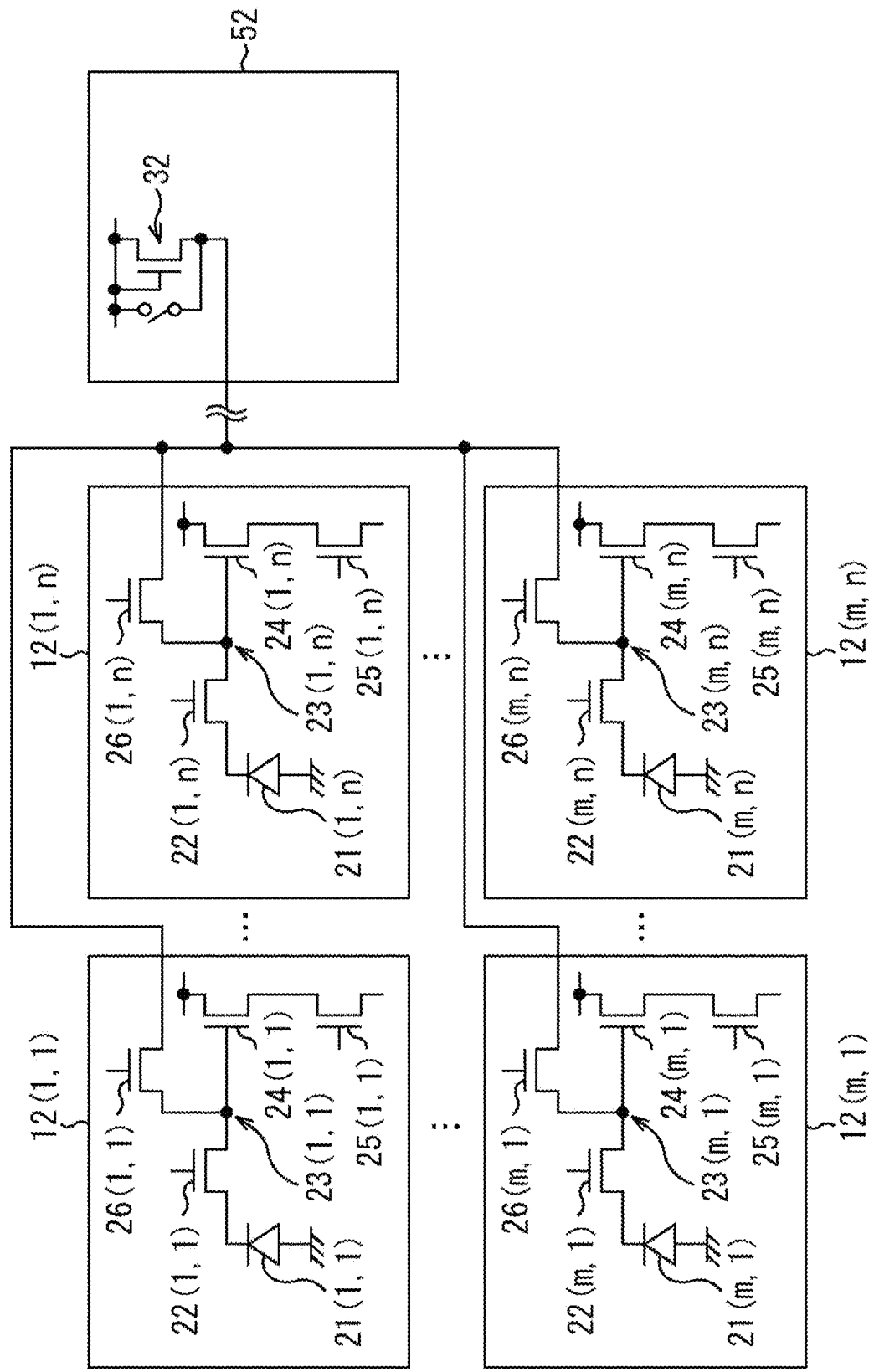
FIG. 19 is a diagram illustrating another example in which a logarithmic conversion circuit is shared among a plurality of pixels.

FIG. 19 illustrates, for example, a configuration of arranging the circuit blocks 54 with the logarithmic conversion circuit 32 on a circuit substrate 52 proportionally to a region of m-by-n pixels 12(1, 1) to 12(m, n) that are arranged vertically in m vertical rows and horizontally in n columns. Thus, it is possible to share the logarithmic conversion circuit 32 for every given number of (m-by-n) pixels 12 arranged in a given region.

Thus, various configurations can be freely employed including a configuration of sharing the logarithmic conversion circuit 32 in the pixel 12X or 12Y having a pixel-sharing structure and a configuration of sharing the logarithmic conversion circuit 32 among the plurality of pixels 12 without being restricted to the examples illustrated.

Figure 20:
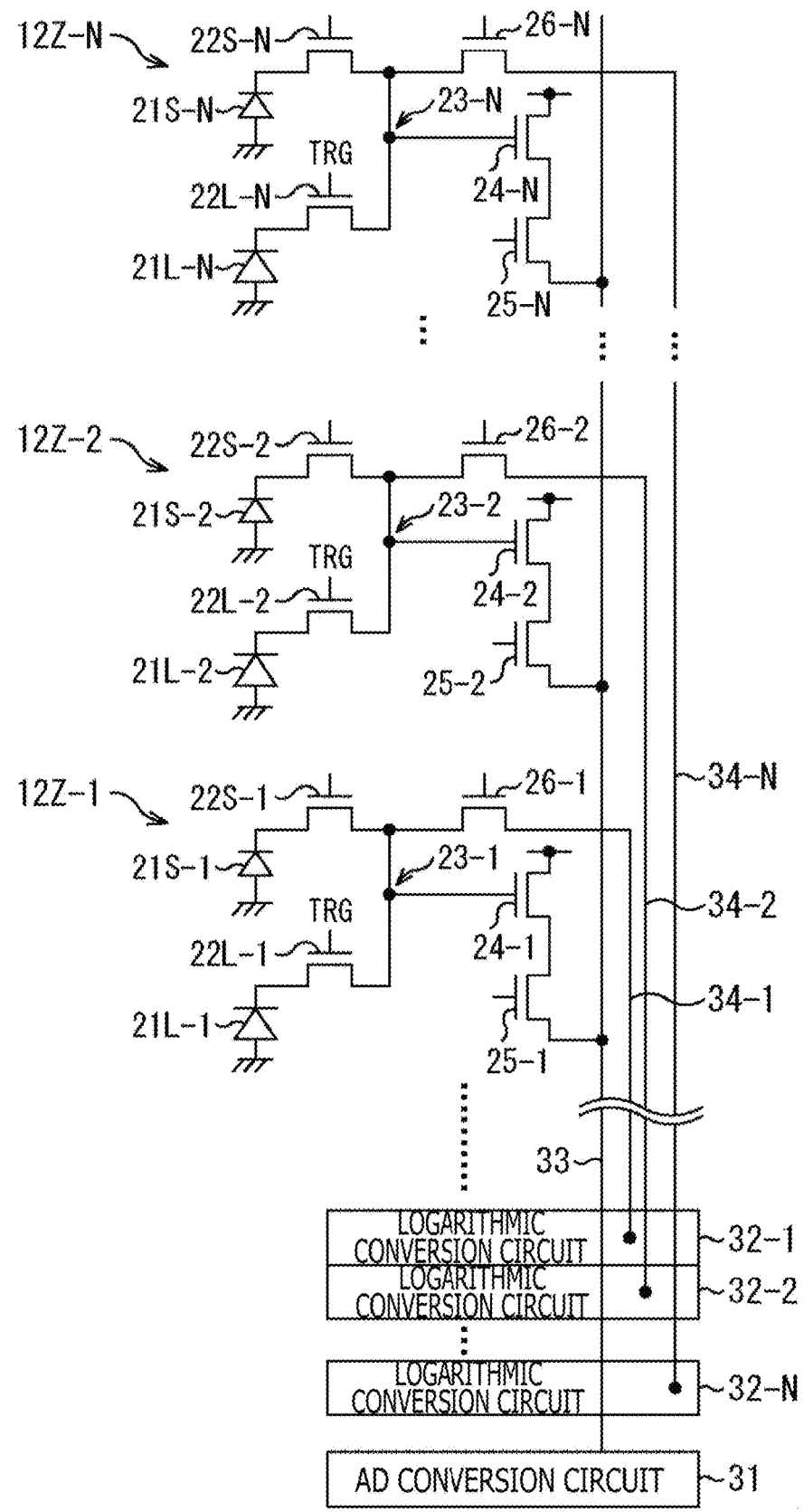
FIG. 20 is a diagram illustrating a configuration example of a pixel sharing structure using photodiodes of different sizes.

For example, FIG. 20 illustrates a configuration example of a pixel sharing structure using the photodiodes 21 of different sizes.

Pixels 12Z illustrated in FIG. 20 have a pixel sharing structure using a small-sized photodiode 21S-1 and a large-sized photodiode 21L-1. Thus, the imaging device 11 can be configured, for example, such that HDR (High Dynamic Range) rendering is conducted by using the differently-sized photodiodes 21, i.e., the photodiodes 21 having different sensitivities.

In addition to the use of the small-sized photodiode 21S-1 and the large-sized photodiode 21L-1 described above, an intermediate-sized photodiode therebetween may also be used in combination.

It should be noted that the present technology is applicable to a configuration employing differently sized photodiodes 21 for each of the pixels 12 in the pixel 12 that does not use a pixel sharing structure. Further, the present technology is applicable to a configuration that changes the sensitivity from one pixel 12 to another by varying the optical property (transmission property) of a color filter, an anti-reflection film, and so on for each of the pixels 12.

As described above, the imaging device 11 permits selection of optimal transistor types (e.g., changing the power supply type, i.e., changing the gate oxide film, changing the threshold, or removing the NMOS and PMOS restrictions) because of the fact that the pixel region 13 and the circuit region 14 can be manufactured separately. This allows the imaging device 11 to capture a wide dynamic range image with higher quality.

Also, the imaging device 11 allows for separate manufacture of the pixel substrate 51 and the circuit substrate 52, thereby making it possible to change the process itself and contributing to optimization. Further, the imaging device 11 allows for pixel signal readout as the pixels 12 with high dynamic range, making it possible to achieve, without increasing the pixel size ratio, HDR rendering comparable to or better than existing art in the HDR scheme that takes advantage of sensitivity difference with varying pixel sizes. That is, it is also possible to easily implement HDR rendering comparable to or better than existing art even with lower exposure ratio or fewer frames in HDR rendering with exposure time controlled per pixel 12 or per frame.

Figure 21:
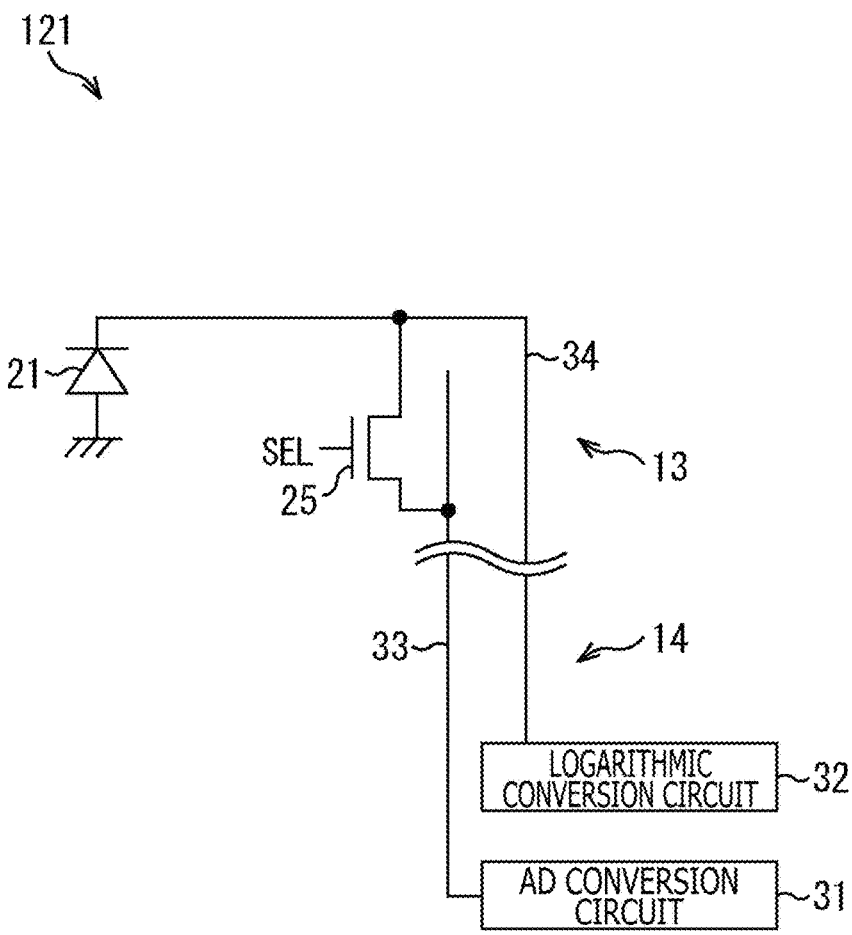
FIG. 21 is a circuit diagram illustrating a configuration example of a pixel that performs only logarithmic readout.

FIG. 21 is a circuit diagram illustrating a configuration example of a pixel that performs only logarithmic readout.

As illustrated in FIG. 21, a pixel 121 includes the photodiode 21 and the selection transistor 25 and performs only logarithmic readout. Also, the pixel 121 has a connection configuration of connecting the cathode terminal of the photodiode 21 to the AD conversion circuit 31 via the selection transistor 25 and directly connecting the cathode terminal of the photodiode 21 to the logarithmic conversion circuit 32.

Then, the pixel 121 does not require the current source 35 as illustrated in FIG. 2 and can read out, by using the photodiode 21 as a current source, an electric charge generated by the photodiode 21 into the AD conversion circuit 31 via the signal line 33. That is, the pixel 121 can output a pixel signal whose electric charge generated by the photodiode 21 changes logarithmically to the AD conversion circuit 31 when the selection transistor 25 turns ON.

The pixel 121 thus configured has a configuration rid of the transfer transistor 22, the FD section 23, the amplifying transistor 24, the selection transistor 25, and the reset transistor 26 as compared to the pixel 12 illustrated in FIG. 2. It should be noted that, in the pixel 121, the internal switch 42 (see, FIG. 4) of the logarithmic conversion circuit 32 has the function of the reset transistor 26. Therefore, the pixel 121 not only reduces the pixel area more than the pixel 12 illustrated in FIG. 2 but also permits easy designing thereof.

Further, the pixel 121 does not require the current source 35 for driving the amplifying transistor 24 as compared to the pixel 12 illustrated in FIG. 2, thereby providing a configuration that does not require a source follower that includes the amplifying transistor 24 and the current source 35. Therefore, the pixel 121 can contribute to reduced noise and reduced power consumption because of elimination of these circuits. Further, the pixel 121 facilitates circuit design of the AD conversion circuit 31.

A description will be given next of the readout of a pixel signal from the pixel 121 with reference to FIG. 22.

Figure 22:
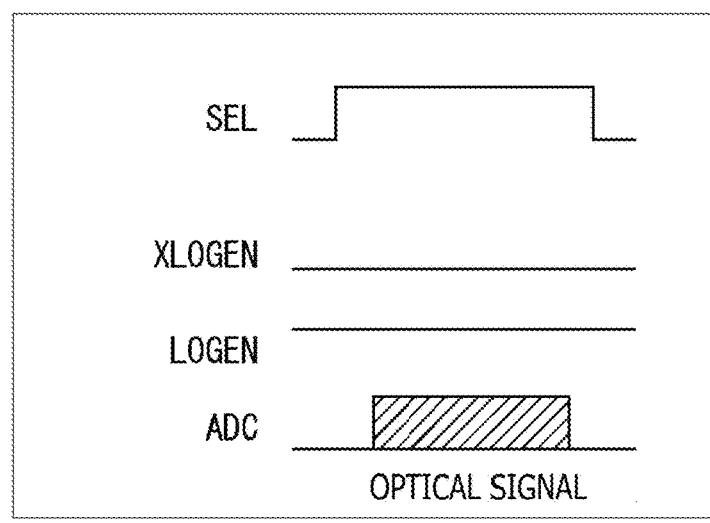
FIG. 22 is a diagram describing readout of a pixel signal from the pixel illustrated in FIG. 21.

As illustrated in FIG. 22, when a pixel signal is read out from the pixel 121, the enable signal LOGEN supplied to the logarithmic conversion circuit 32 is always at high level, and the inverted enable signal XLOGEN supplied to the logarithmic conversion circuit 32 is always at low level. Then, while the selection signal SEL is at high level, an electric charge continues to be transferred to the AD conversion circuit 31 from the photodiode 21. As a result, the electric charge converted from light by the photodiode 21 flows into the diode-connected transistor (e.g., NMOS transistor 41 in FIG. 4A, PMOS transistor 43 in FIG. 4B), allowing for readout of a pixel signal that changes logarithmically.

Figure 23:
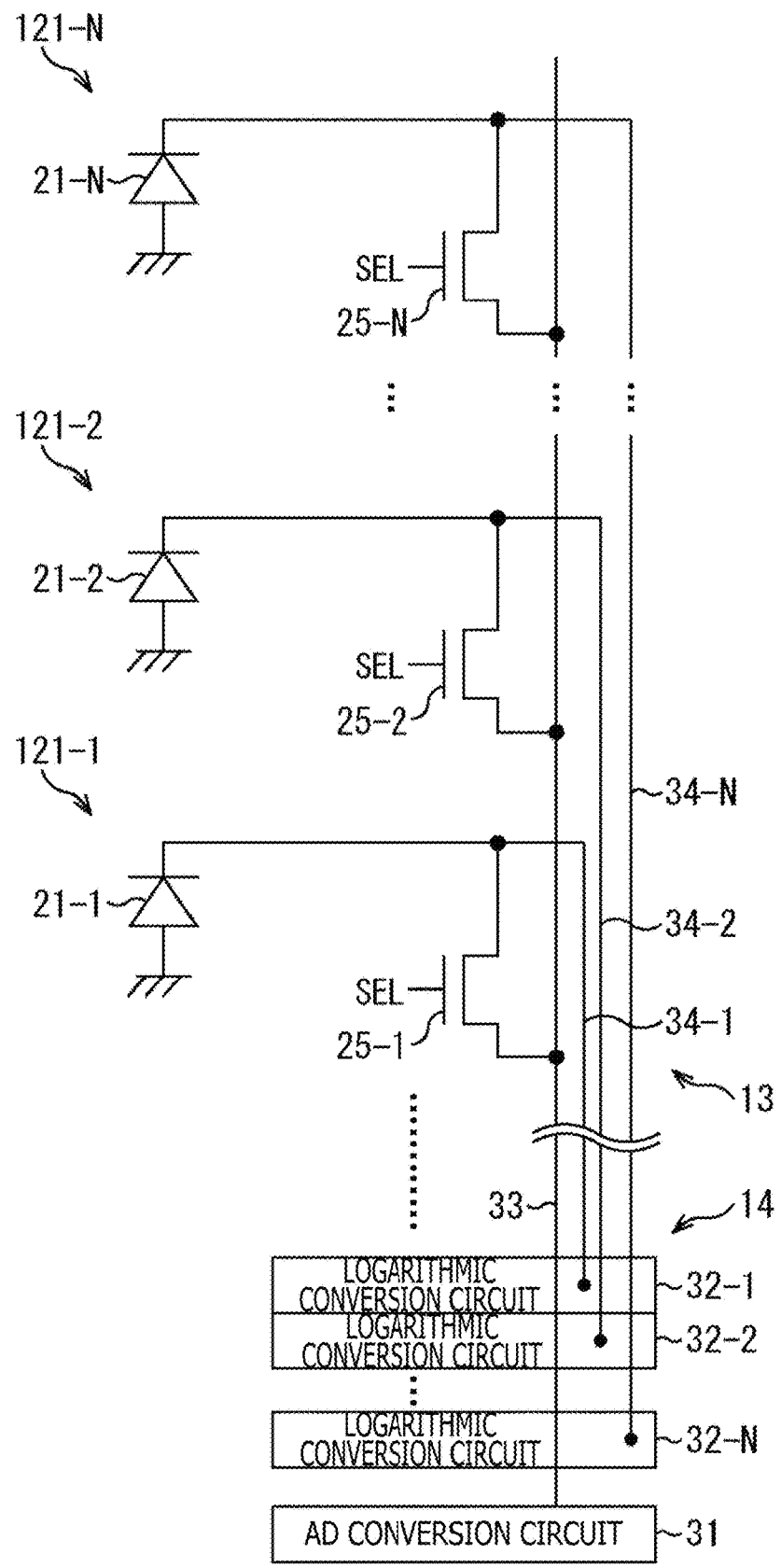
FIG. 23 is a diagram illustrating an arrangement example of a logarithmic conversion circuit for the column of pixels illustrated in FIG. 21.

Next, FIG. 23 is a diagram illustrating an arrangement example of the logarithmic conversion circuit 32 for a column of the pixels 121 arranged in an array in the pixel region 13.

In the arrangement example illustrated in FIG. 23, the plurality of logarithmic conversion circuits 32 are provided, for a column of the pixels 121, in numbers proportional to the number of pixels 121 arranged in that column. That is, the imaging device 11 can include the N logarithmic conversion circuits 32-1 to 32-N that correspond respectively to N pixels 121-1 to 121-N provided in a column in the pixel region 13.

Thus, in the imaging device 11 having one logarithmic conversion circuit 32 for each of the pixels 121, it is possible to perform logarithmic readout of a pixel signal for each of the pixels 121. Also, in the imaging device 11, these logarithmic conversion circuits 32 are arranged in the circuit region 14 outside the pixel region 13. As a result, the imaging device 11 can provide a higher degree of design freedom with respect to the size, type, and other features of the transistors included in the logarithmic conversion circuit 32.

A description will be given next of a modification example of the logarithmic conversion circuit 32 with reference to FIG. 24.

Figure 24:
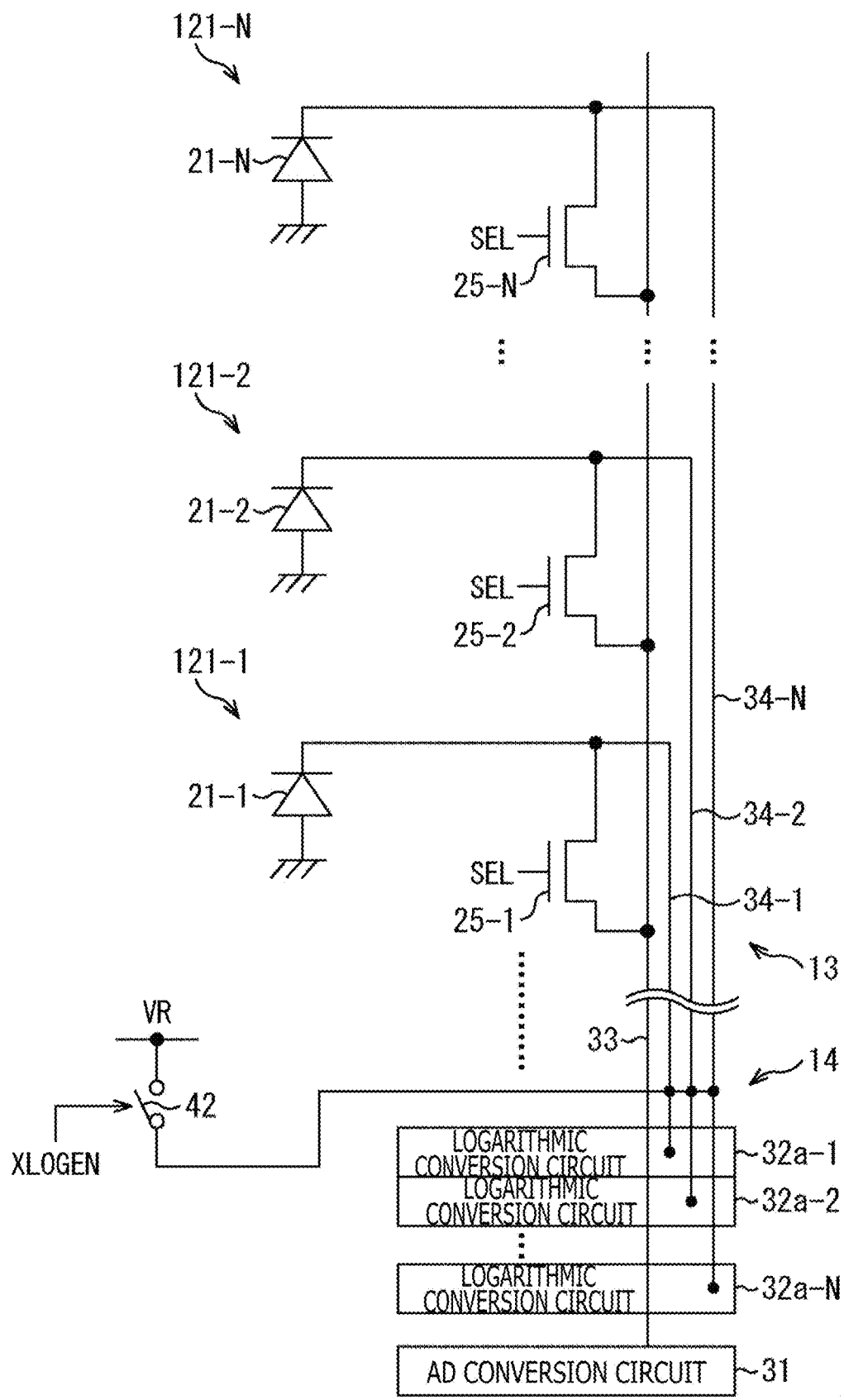
FIG. 24 is a diagram describing a modification example of the logarithmic conversion circuit.

As illustrated in FIG. 24, N logarithmic conversion circuits 32a-1 to 32a-N are configured to share the switch 42 that controls the connection with the power supply VR in accordance with the inverted enable signal XLOGEN. The switch 42 includes the function that an electric charge generated by the pixel 121 to be reset.

In the circuit configurations of the logarithmic conversion circuits 32 described above with reference to FIG. 4, the switch 42 is included in all the configuration examples, and the switch 42 can be provided outside the N logarithmic conversion circuits 32a-1 to 32a-N because of the sharing of the switch 42 among the N logarithmic conversion circuits 32a-1 to 32a-N. That is, the logarithmic conversion circuits 32a-1 to 32a-N are configured such that the switch 42 is not arranged within the circuit configuration of the logarithmic conversion circuits 32 illustrated in FIG. 4.

Thus, the imaging device 11 permits reduction of the circuit area because of the sharing of the switch 42 among the logarithmic conversion circuits 32a-1 to 32a-N.

It should be noted that the configuration of sharing the switch 42 as done with the N logarithmic conversion circuits 32a-1 to 32a-N is applicable not only to the pixel 121 but also to the pixel 12.

Figure 25:
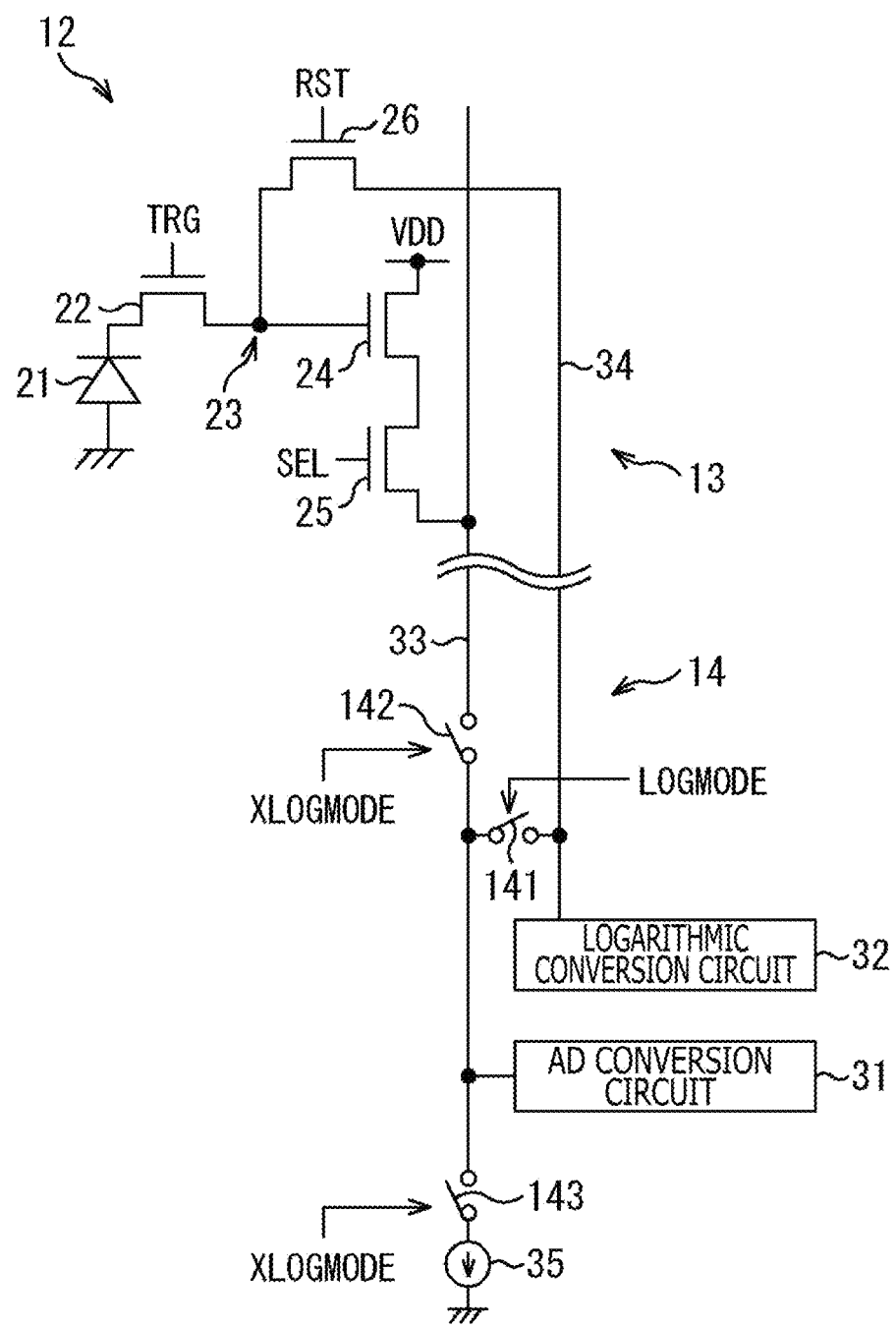
FIG. 25 is a circuit diagram illustrating a modification example of a basic circuit configuration of a pixel.

Next, FIG. 25 is a circuit diagram illustrating a modification example of a basic circuit configuration of the pixel 12 illustrated in FIG. 2. It should be noted that, in the basic circuit configuration of the pixel 12 illustrated in FIG. 25, the components common to those of the pixel 12 illustrated in FIG. 2 are denoted by the same reference numerals, and the detailed description thereof will be omitted.

In the basic circuit configuration of the pixel 12 illustrated in FIG. 25, the pixel 12 is configured similarly to the pixel 12 illustrated in FIG. 2 and includes the AD conversion circuit 31, the logarithmic conversion circuit 32, and the current source 35. Then, in the basic circuit configuration of the pixel 12 illustrated in FIG. 25, a switch 141 is added in such a manner as to connect the signal lines 33 and 34, and switches 142 and 143 are added to the signal line 33. The switch 142 connects the pixel 12 and a connecting point between the signal line 33 and the switch 141, and the switch 142 connects a connecting point between the signal line 33 and the AD conversion circuit 31 and the current source 35.

Then, the switch 141 opens and closes in accordance with a logarithmic mode signal LOGMODE, and the switches 142 and 143 open and close in accordance with an inverted logarithmic mode signal XLOGMODE, an inversion of the logarithmic mode signal LOGMODE.

Figure 26:
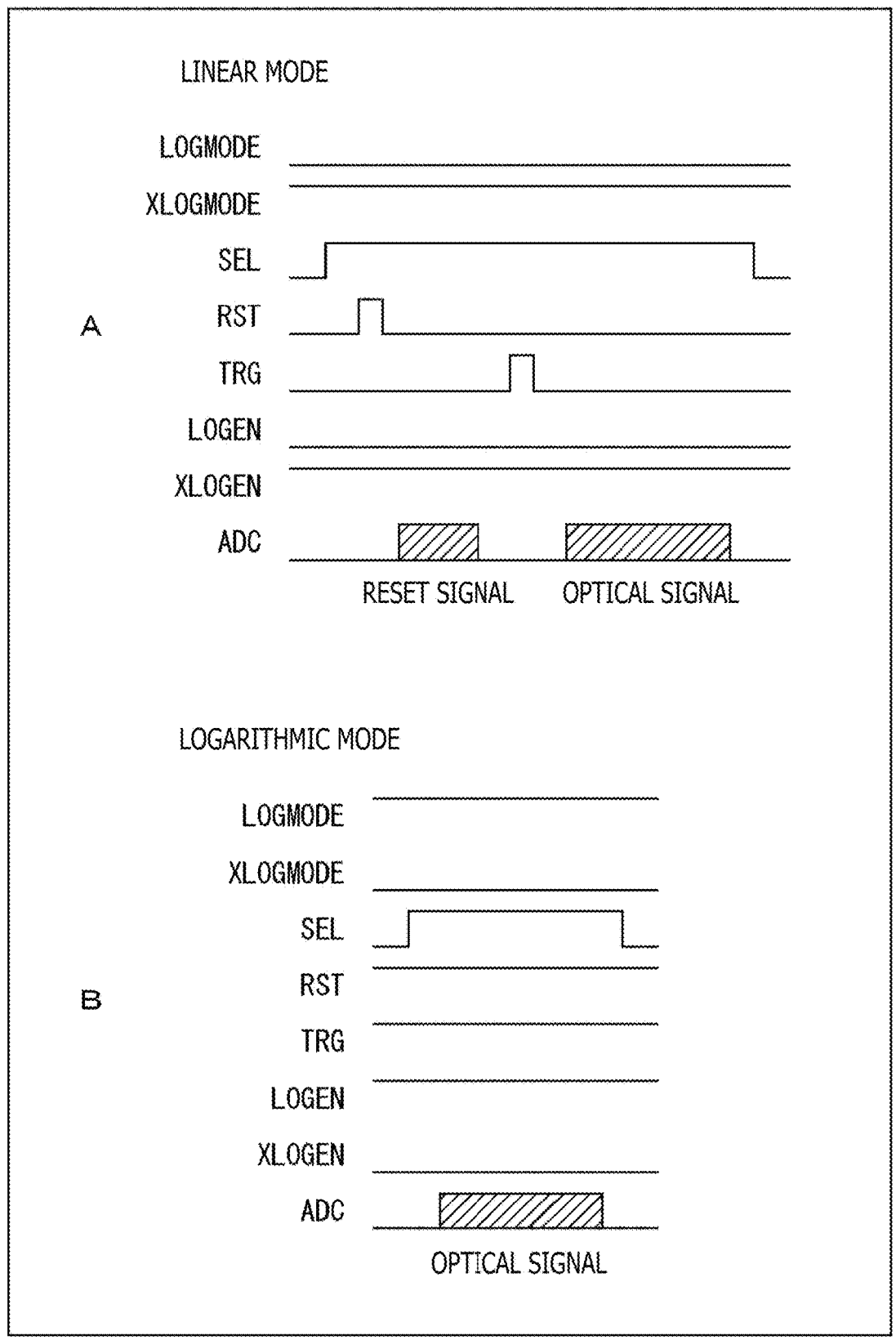
FIG. 26 A depicts diagrams describing pixel signal readout in the basic circuit configuration of a pixel illustrated in FIG. 24.

A description will be given next of pixel signal readout in the basic circuit configuration of the pixel 12 illustrated in FIG. 25 with reference to FIG. 26.

FIG. 26A illustrates an example of a drive signal when a pixel signal is read out from the pixel 12 in linear mode, and FIG. 26B illustrates an example of a drive signal when a pixel signal is read out from the pixel 12 in logarithmic mode.

As illustrated in FIG. 26A, in the case of linear mode, the low-level logarithmic mode signal LOGMODE is supplied to the switch 141, and the high-level inverted logarithmic mode signal XLOGMODE is supplied to the switches 142 and 143. In the case of linear mode, therefore, the switch 141 turns OFF, and the switches 142 and 143 turn ON.

That is, in linear mode, the pixel 12 substantially has a connection configuration similar to that illustrated in FIG. 2, making it possible to read out a pixel signal as in the linear mode described above with reference to FIG. 6A.

As illustrated in FIG. 26B, in the case of logarithmic mode, the low-level logarithmic mode signal LOGMODE is supplied to the switch 141, and the high-level inverted logarithmic mode signal XLOGMODE is supplied to the switches 142 and 143. In the case of linear mode, therefore, the switch 141 turns OFF, and the switches 142 and 143 turn ON. In the case of linear mode, therefore, the switch 141 turns ON, and the switches 142 and 143 turn OFF. Also, in the case of logarithmic mode, the reset signal RST and the transfer signal TRG that are always at high level are supplied to the pixel 12.

In the case of logarithmic mode, therefore, while the selection signal SEL is at high level, the photodiode 21 is directly connected to the AD conversion circuit 31 and the logarithmic conversion circuit 32 as with the pixel 121 illustrated in FIG. 21. Also, in this case, when the switch 143 turns OFF, the current source 35 is not connected. As a result, an electric charge converted from light by the photodiode 21 flows into the diode-connected transistor (e.g., NMOS transistor 41 in FIG. 4A, PMOS transistor 43 in FIG. 4B) of the logarithmic conversion circuit 32, allowing for readout of a pixel signal that changes logarithmically into the AD conversion circuit 31.

That is, in logarithmic mode, the pixel 12 substantially has a connection configuration similar to the pixel 121 illustrated in FIG. 21, making it possible to read out a pixel signal as in the logarithmic mode described above with reference to FIG. 22.

It should be noted that the imaging device 11 as described above is applicable to various pieces of electronic equipment such as digital still camera, digital video camera, and other imaging systems and mobile phone having imaging function or other equipment having imaging function.

Figure 27:
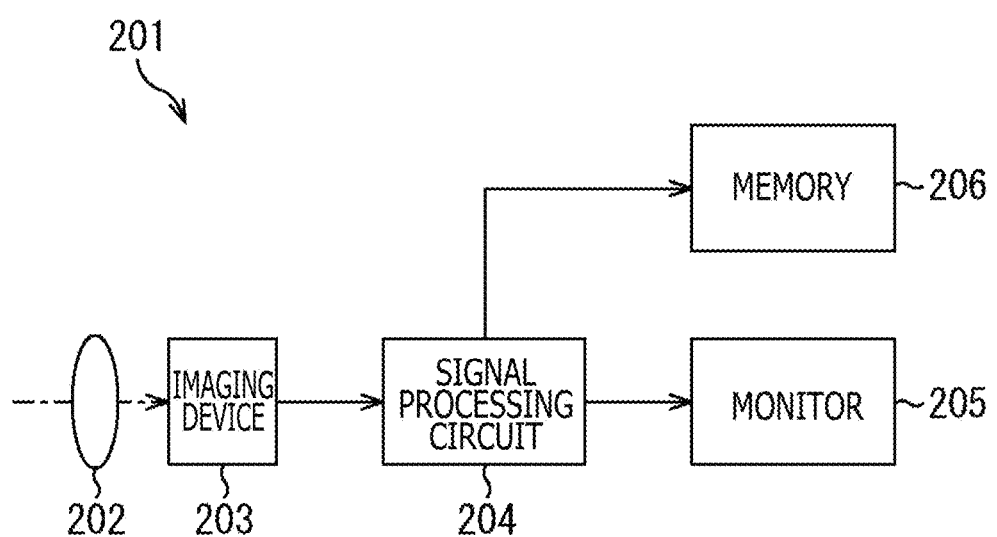
FIG. 27 is a block diagram illustrating a configuration example of an embodiment of an imaging apparatus to which the present technology is applied.

FIG. 27 is a block diagram illustrating a configuration example of an imaging apparatus incorporated in electronic equipment.

As illustrated in FIG. 27, an imaging apparatus 201 includes an optics 202, an imaging device 203, a signal processing circuit 204, a monitor 205, and a memory 206 and can capture still images and videos.

The optics 202 includes one or a plurality of lenses, guides image light (incident light) from a subject into the imaging device 203, and forms an image on a light-receiving surface (sensor section) of the imaging device 203.

The imaging device 11 described above is, for example, used as the imaging device 203. Electrons are accumulated for a given time period in the imaging device 203 in proportion to the image formed on the light-receiving surface via the optics 202. Then, a signal proportional to the electrons accumulated in the imaging device 203 is supplied to the signal processing circuit 204.

The signal processing circuit 204 subjects the pixel signal output from the imaging device 203 to various signal processing. The image (image data) acquired as a result of signal processing performed by the signal processing circuit 204 is supplied and displayed on the monitor 205 or supplied and stored (recorded) in the memory 206.

In the imaging apparatus 201 thus configured, the use of the imaging device 11 described above makes it possible to capture an image with wide dynamic range. As a result, the subject illuminance fits sufficiently within the range, contributing to improved exposure control accuracy for the subject and positively providing an image with proper exposure.

FIG. 28 is a diagram illustrating a usage example using the image sensor described above.

The image sensor described above can find application, for example, in a variety of cases where visible light, infrared light, ultraviolet light, X-ray, and other light are sensed as described below.

- Apparatuses for shooting images for appreciation such as digital camera and mobile phone having a camera function
- Apparatuses for traffic use such as vehicle-mounted sensor for shooting front, back, surroundings, inside, and so on of an automobile for safe driving such as automatic stop and for recognition of driver's state, monitoring camera for monitoring traveling vehicles and road, and distance measuring sensor for measuring vehicle-to-vehicle distance and so on
- Apparatuses for use in home appliances such as TV, refrigerator, and air-conditioner to shoot a user's gesture and operate the appliance in accordance with the gesture
- Apparatuses for medical and healthcare use such as endoscope and apparatus for shooting blood cells by receiving infrared light
- Apparatuses for security use such as monitoring camera for crime prevention and camera for individual authentication
- Apparatuses for cosmetic use such as skin measuring device for shooting skin and microscope for shooting scalp
- Apparatuses for sports use such as action camera and wearable camera for sports applications Apparatuses for agricultural use such as camera for monitoring fields and crops It should be noted that the present technology can have the following configurations.

(1) A solid-state imaging device including:

a pixel region where a plurality of pixels that perform photoelectric conversion are arranged; and a circuit region where at least a logarithmic conversion circuit is arranged that reads out a pixel signal from the pixel through a logarithmic readout scheme in which the pixel signal changes approximately logarithmically in proportion to the amount of light received by the pixel.

(2) The solid-state imaging device of feature (1), in which when a pixel signal is read out from the pixel, the logarithmic conversion circuit switches between the logarithmic readout scheme and a linear readout scheme in which a pixel signal changes approximately linearly in proportion to the amount of light received by the pixel.

(3) The solid-state imaging device of feature (1) or (2), in which the logarithmic conversion circuit is connected, via a given transistor, to a floating diffusion region to which an electric charge, generated by a photoelectric conversion section of the pixel, is transferred.

(4) The solid-state imaging device of any one of features (1) to (3), in which in the case where a pixel signal is read out from the pixel through the linear readout scheme, the logarithmic conversion circuit supplies a source voltage to the pixel via a switch, and in the case where a pixel signal is read out from the pixel through the logarithmic readout scheme, the logarithmic conversion circuit supplies a source voltage to the pixel via a circuit that includes a diode-connected MOS (Metal-Oxide Semiconductor) transistor.

(5) The solid-state imaging device of any one of features (1) to (3), in which the logarithmic conversion circuits are arranged, for each column of the pixels arranged in the pixel region, in numbers proportional to the number of pixels arranged in that column.

(6) The solid-state imaging device of any one of features (1) to (3), in which the logarithmic conversion circuits are arranged one for each column of the pixels arranged in the pixel region.

(7) The solid-state imaging device of any one of features (1) to (6), in which the one logarithmic conversion circuit is arranged to correspond to a given number of the pixels arranged in the pixel region.

(8) The solid-state imaging device of any one of features (1) to (7) including a laminated structure in which a pixel substrate on which the pixel region is formed and a circuit substrate on which the circuit region is formed are laminated one on top of the other.

(9) The solid-state imaging device of feature (8), in which the one logarithmic conversion circuit is arranged on the circuit substrate to correspond to the one pixel formed on the pixel substrate.

(10) The solid-state imaging device of feature (8), in which the one logarithmic conversion circuit is arranged on the circuit substrate to correspond to a pixel unit that includes the plurality of pixels formed on the pixel substrate.

(11) The solid-state imaging device of any one of features (1) to (10), in which in the pixel region, the pixels based on the linear readout scheme and the pixels based on the logarithmic readout scheme are arranged column by column through the pixels.

(12) The solid-state imaging device of any one of features (1) to (11), in which in the pixel region, the pixels based on the linear readout scheme and the pixels based on the logarithmic readout scheme are arranged row by row through the pixels.

(13) The solid-state imaging device of any one of features (1) to (12), in which in the pixel region, the pixels based on the linear readout scheme and the pixels based on the logarithmic readout scheme are arranged alternately column by column and row by row.

(14) The solid-state imaging device of any one of features (1) to (13), in which in the pixel region, the pixels based on the linear readout scheme and the pixels based on the logarithmic readout scheme are arranged one for each pixel unit that includes the plurality of pixels.

(15) The solid-state imaging device of any one of features (1) to (14), in which a pixel signal is read out through the logarithmic readout scheme during automatic exposure operation for image capture and a pixel signal is read out through the linear readout scheme during image capture.

(16) The solid-state imaging device of any one of features (1) to (15), in which the pixel includes:

a photoelectric conversion section adapted to convert incident light into an electric charge through photoelectric conversion and accumulate the electric charge; and a selection transistor adapted to connect a first signal line and the photoelectric conversion section so as to place the pixel into a selected state for outputting a pixel signal, the pixel further includes:

an AD conversion circuit adapted to perform AD (Analog to Digital) conversion of the pixel signal output via the first signal line, and the photoelectric conversion section is directly connected to the logarithmic conversion circuit via a second signal line.

(17) The solid-state imaging device of feature (16), in which the logarithmic conversion circuits are arranged, for each column of the pixels arranged in the pixel region, in numbers proportional to the number of pixels arranged in that column.

(18) The solid-state imaging device of feature (17), in which the plurality of logarithmic conversion circuits connected to the pixels arranged in a column in the pixel region share a switch for resetting electric charges generated by the pixels.

(19) The solid-state imaging device of any one of features (1) to (15), in which the pixel includes:

a photoelectric conversion section adapted to convert incident light into an electric charge through photoelectric conversion and accumulate the electric charge;

a transfer transistor adapted to transfer the electric charge accumulated in the photoelectric conversion section;

a floating diffusion region adapted to accumulate the electric charge transferred via the transfer transistor;

an amplifying transistor adapted to output a pixel signal whose level is proportional to the electric charge accumulated in the floating diffusion region;

a selection transistor adapted to connect the first signal line and the amplifying transistor and place the pixel into a selected state for outputting a pixel signal, and a reset transistor adapted to connect the floating diffusion region to the logarithmic conversion circuit via a second signal line, and the pixel further includes:

a current source included in a source follower together with the amplifying transistor; and an AD conversion circuit adapted to perform AD conversion of the pixel signal output via the first signal line.

(20) The solid-state imaging device of feature (19) further including:

a first switch arranged between the first and second signal lines;

a second switch arranged between the pixel and a connecting point between the first signal line and the first switch; and a third switch arranged between a connecting point between the first signal line and the AD conversion circuit and the current source, in which when a pixel signal is read out from the pixel through the logarithmic readout scheme, the first switch turns ON, and the second and third switches turn OFF.

(21) The solid-state imaging device of feature (20), in which when a pixel signal is read out from the pixel through a linear readout scheme in which the pixel signal changes approximately linearly in proportion to the amount of light received by the pixel, the first switch turns OFF, and the second and third switches turn ON.

(22) A driving method of a solid-state imaging device, the solid-state imaging device including:

a pixel region where a plurality of pixels that perform photoelectric conversion are arranged; and a circuit region where at least a logarithmic conversion circuit is arranged that reads out a pixel signal from the pixel through a logarithmic readout scheme in which the pixel signal changes approximately logarithmically in proportion to the amount of light received by the pixel, in which in the case where a pixel signal is read out from the pixel through the logarithmic readout scheme, a source voltage is supplied to the pixel via a circuit that includes a diode-connected MOS (Metal-Oxide Semiconductor) transistor.

(23) Electronic equipment including:

a solid-state imaging device, the solid-state imaging device including a pixel region where a plurality of pixels that perform photoelectric conversion are arranged, and a circuit region where at least a logarithmic conversion circuit is arranged that reads out a pixel signal from the pixel through a logarithmic readout scheme in which the pixel signal changes approximately logarithmically in proportion to the amount of light received by the pixel.

It should be noted that embodiments of the present technology are not limited to that described above and can be modified in various ways without departing from the gist of the present technology.

REFERENCE SIGNS LIST

11 Imaging device
12 Pixel
13 Pixel region
14 Circuit region
21 Photodiode
22 Transfer transistor
23 FD section
24 Amplifying transistor
25 Selection transistor
26 Reset transistor
27 Logarithmic switching transistor
31 AD conversion circuit
32 Logarithmic conversion circuit
33 and 34 Signal lines
41 NMOS transistor
42 Switch
43 PMOS transistor
44 Switch
51 Pixel substrate
52 Circuit substrate
53 Pixel unit
54 Circuit block

The invention claimed is:

1. A solid-state imaging device comprising:

a pixel region where a plurality of pixels that perform photoelectric conversion are arranged; and a circuit region where at least a logarithmic conversion circuit is arranged that reads out a pixel signal from the pixel through a logarithmic readout scheme in which the pixel signal changes approximately logarithmically in proportion to the amount of light received by the pixel, wherein the pixel comprises:

a photoelectric conversion section adapted to convert incident light into an electric charge through photoelectric conversion and accumulate the electric charge;

a transfer transistor adapted to transfer the electric charge accumulated in the photoelectric conversion section;

a floating diffusion region adapted to accumulate the electric charge transferred via the transfer transistor;

an amplifying transistor adapted to output a pixel signal whose level is proportional to the electric charge accumulated in the floating diffusion region;

a selection transistor adapted to connect the first signal line and the amplifying transistor and place the pixel into a selected state for outputting a pixel signal, and a reset transistor adapted to connect the floating diffusion region to the logarithmic conversion circuit via a second signal line, and the pixel further comprises:

a current source included in a source follower together with the amplifying transistor; and an AD conversion circuit adapted to perform AD conversion of the pixel signal output via the first signal line; and further comprising:

a first switch arranged between the first and second signal lines;

a second switch arranged between the pixel and a connecting point between the first signal line and the first switch; and a third switch arranged between a connecting point between the first signal line and the AD conversion circuit and the current source, wherein when a pixel signal is read out from the pixel through the logarithmic readout scheme, the first switch turns ON, and the second and third switches turn OFF.

2. The solid-state imaging device of claim 1, wherein when a pixel signal is read out from the pixel, the logarithmic conversion circuit switches between the logarithmic readout scheme and a linear readout scheme in which a pixel signal changes approximately linearly in proportion to the amount of light received by the pixel.

3. The solid-state imaging device of claim 1, wherein the logarithmic conversion circuit is connected, via a given transistor, to a floating diffusion region to which an electric charge, generated by a photoelectric conversion section of the pixel, is transferred.

4. The solid-state imaging device of claim 1, wherein
in the case where a pixel signal is read out from the pixel through the linear readout scheme, the logarithmic conversion circuit supplies a source voltage to the pixel via a switch, and
in the case where a pixel signal is read out from the pixel through the logarithmic readout scheme, the logarithmic conversion circuit supplies a source voltage to the pixel via a circuit that includes a diode-connected MOS (Metal-Oxide Semiconductor) transistor.

5. The solid-state imaging device of claim 1, wherein the logarithmic conversion circuits are arranged, for each column of the pixels arranged in the pixel region, in numbers proportional to the number of pixels arranged in that column.

6. The solid-state imaging device of claim 1, wherein the logarithmic conversion circuits are arranged one for each column of the pixels arranged in the pixel region.

7. The solid-state imaging device of claim 1, wherein the one logarithmic conversion circuit is arranged to correspond to a given number of the pixels arranged in the pixel region.

8. The solid-state imaging device of claim 1 including a laminated structure in which a pixel substrate on which the pixel region is formed and a circuit substrate on which the circuit region is formed are laminated one on top of the other.

9. The solid-state imaging device of claim 8, wherein the one logarithmic conversion circuit is arranged on the circuit substrate to correspond to the one pixel formed on the pixel substrate.

10. The solid-state imaging device of claim 8, wherein the one logarithmic conversion circuit is arranged on the circuit substrate to correspond to a pixel unit that includes the plurality of pixels formed on the pixel substrate.

11. The solid-state imaging device of claim 1, wherein in the pixel region, the pixels based on the linear readout scheme and the pixels based on the logarithmic readout scheme are arranged column by column through the pixels.

12. The solid-state imaging device of claim 1, wherein in the pixel region, the pixels based on the linear readout scheme and the pixels based on the logarithmic readout scheme are arranged row by row through the pixels.

13. The solid-state imaging device of claim 1, wherein in the pixel region, the pixels based on the linear readout scheme and the pixels based on the logarithmic readout scheme are arranged alternately column by column and row by row.

14. The solid-state imaging device of claim 1, wherein in the pixel region, the pixels based on the linear readout scheme and the pixels based on the logarithmic readout scheme are arranged one for each pixel unit that includes the plurality of pixels.

15. The solid-state imaging device of claim 1, wherein a pixel signal is read out through the logarithmic readout scheme during automatic exposure operation for image capture and a pixel signal is read out through the linear readout scheme during image capture.

16. The solid-state imaging device of claim 1, wherein the pixel comprises:
a photoelectric conversion section adapted to convert incident light into an electric charge through photoelectric conversion and accumulate the electric charge; and
a selection transistor adapted to connect a first signal line and the photoelectric conversion section so as to place the pixel into a selected state for outputting a pixel signal,
the pixel further comprises:
an AD conversion circuit adapted to perform AD (Analog to Digital) conversion of the pixel signal output via the first signal line, and
the photoelectric conversion section is directly connected to the logarithmic conversion circuit via a second signal line.

17. The solid-state imaging device of claim 16, wherein the logarithmic conversion circuits are arranged, for each column of the pixels arranged in the pixel region, in numbers proportional to the number of pixels arranged in that column.

18. The solid-state imaging device of claim 17, wherein the plurality of logarithmic conversion circuits connected to the pixels arranged in a column in the pixel region share a switch for resetting electric charges generated by the pixels.

19. The solid-state imaging device of claim 1, wherein when a pixel signal is read out from the pixel through a linear readout scheme in which the pixel signal changes approximately linearly in proportion to the amount of light received by the pixel, the first switch turns OFF, and the second and third switches turn ON.

20. Electronic equipment comprising:
a solid-state imaging device, the solid-state imaging device including
a pixel region where a plurality of pixels that perform photoelectric conversion are arranged, and
a circuit region where at least a logarithmic conversion circuit is arranged that reads out a pixel signal from the pixel through a logarithmic readout scheme in which the pixel signal changes approximately logarithmically in proportion to the amount of light received by the pixel, wherein
the pixel comprises:
a photoelectric conversion section adapted to convert incident light into an electric charge through photoelectric conversion and accumulate the electric charge;
a transfer transistor adapted to transfer the electric charge accumulated in the photoelectric conversion section;
a floating diffusion region adapted to accumulate the electric charge transferred via the transfer transistor;
an amplifying transistor adapted to output a pixel signal whose level is proportional to the electric charge accumulated in the floating diffusion region;
a selection transistor adapted to connect the first signal line and the amplifying transistor and place the pixel into a selected state for outputting a pixel signal, and
a reset transistor adapted to connect the floating diffusion region to the logarithmic conversion circuit via a second signal line, and the pixel further comprises:
a current source included in a source follower together with the amplifying transistor; and
an AD conversion circuit adapted to perform AD conversion of the pixel signal output via the first signal line; and further comprising:
a first switch arranged between the first and second signal lines;
a second switch arranged between the pixel and a connecting point between the first signal line and the first switch; and
a third switch arranged between a connecting point between the first signal line and the AD conversion circuit and the current source, wherein
when a pixel signal is read out from the pixel through the logarithmic readout scheme, the first switch turns ON, and the second and third switches turn OFF.

* * * * *